United States Patent
Foo et al.

(10) Patent No.: US 11,557,825 B2
(45) Date of Patent: Jan. 17, 2023

(54) ANTENNA INTEGRATED DISPLAY SCREEN

(71) Applicants: Senglee Foo, Ottawa (CA); Wen Tong, Ottawa (CA)

(72) Inventors: Senglee Foo, Ottawa (CA); Wen Tong, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 53 days.

(21) Appl. No.: 17/065,166

(22) Filed: Oct. 7, 2020

(65) Prior Publication Data

US 2021/0111477 A1 Apr. 15, 2021

Related U.S. Application Data

(60) Provisional application No. 62/915,099, filed on Oct. 15, 2019.

(51) Int. Cl.
*H01Q 1/22* (2006.01)
*H01Q 1/38* (2006.01)
(Continued)

(52) U.S. Cl.
CPC ............ *H01Q 1/2266* (2013.01); *H01Q 1/38* (2013.01); *H01Q 1/44* (2013.01); *H05K 1/0274* (2013.01); *H05K 2201/10106* (2013.01)

(58) Field of Classification Search
CPC .......... H01Q 1/2266; H01Q 1/38; H01Q 1/44; H01Q 15/0013; H01Q 21/064;
(Continued)

(56) References Cited

U.S. PATENT DOCUMENTS 6,388,621 B1    5/2002  Lynch
8,213,757 B2 *  7/2012  Harrysson ............. H01Q 1/243
                                                        385/120
(Continued)

FOREIGN PATENT DOCUMENTS

CN   106921030 A    7/2017
CN   109119742 A    1/2019
WO   2013067541 A1  5/2013

OTHER PUBLICATIONS

Hong et al. "Optically Invisible Antenna Integrated Within an OLED Touch Display Panel for IoT Applications," in IEEE Transactions on Antennas and Propagation, vol. 65, No. 7, pp. 3750-3755, Jul. 2017, doi: 10.1109/TAP.2017.2705127.*

*Primary Examiner* — Seung H Lee

(57) ABSTRACT

The present invention provides an integrated antenna and visual display apparatus, or one of an antenna apparatus and visual display apparatus which is integratable with the other. Apertures are formed in a visual display, such as an OLED display. The apertures when formed in a conductive layer operate as radiating bodies of an antenna array. A subset of sub-pixels of the visual display can be removed in line with the apertures. An optically transparent substrate is located over the visual display, and an array of further conductive elements, which may be optically transparent, is disposed on an exterior of this substrate. The further conductive elements operate to direct the antenna signals through the substrate, by coupling in an impedance-matched manner with the radiating apertures.

17 Claims, 21 Drawing Sheets

(51) Int. Cl.
*H05K 1/02* (2006.01)
*H01Q 1/44* (2006.01)

(58) Field of Classification Search
CPC .............. H01Q 1/243; H05K 1/0274; H05K 2201/10106; H05K 1/165; H05K 2201/10098
See application file for complete search history.

(56) References Cited

U.S. PATENT DOCUMENTS

| | | | |
|---|---|---|---|
| 8,831,537 B2* | 9/2014 | Fratti | H01Q 1/44 |
| | | | 343/907 |
| 9,553,352 B2* | 1/2017 | Pan | H01Q 1/243 |
| 2013/0180660 A1 | 7/2013 | Nozawa et al. | |
| 2013/0257672 A1 | 10/2013 | Lu et al. | |
| 2017/0263179 A1 | 9/2017 | Aurongzeb et al. | |
| 2017/0285844 A1 | 10/2017 | Park et al. | |
| 2019/0027808 A1 | 1/2019 | Mow et al. | |

* cited by examiner

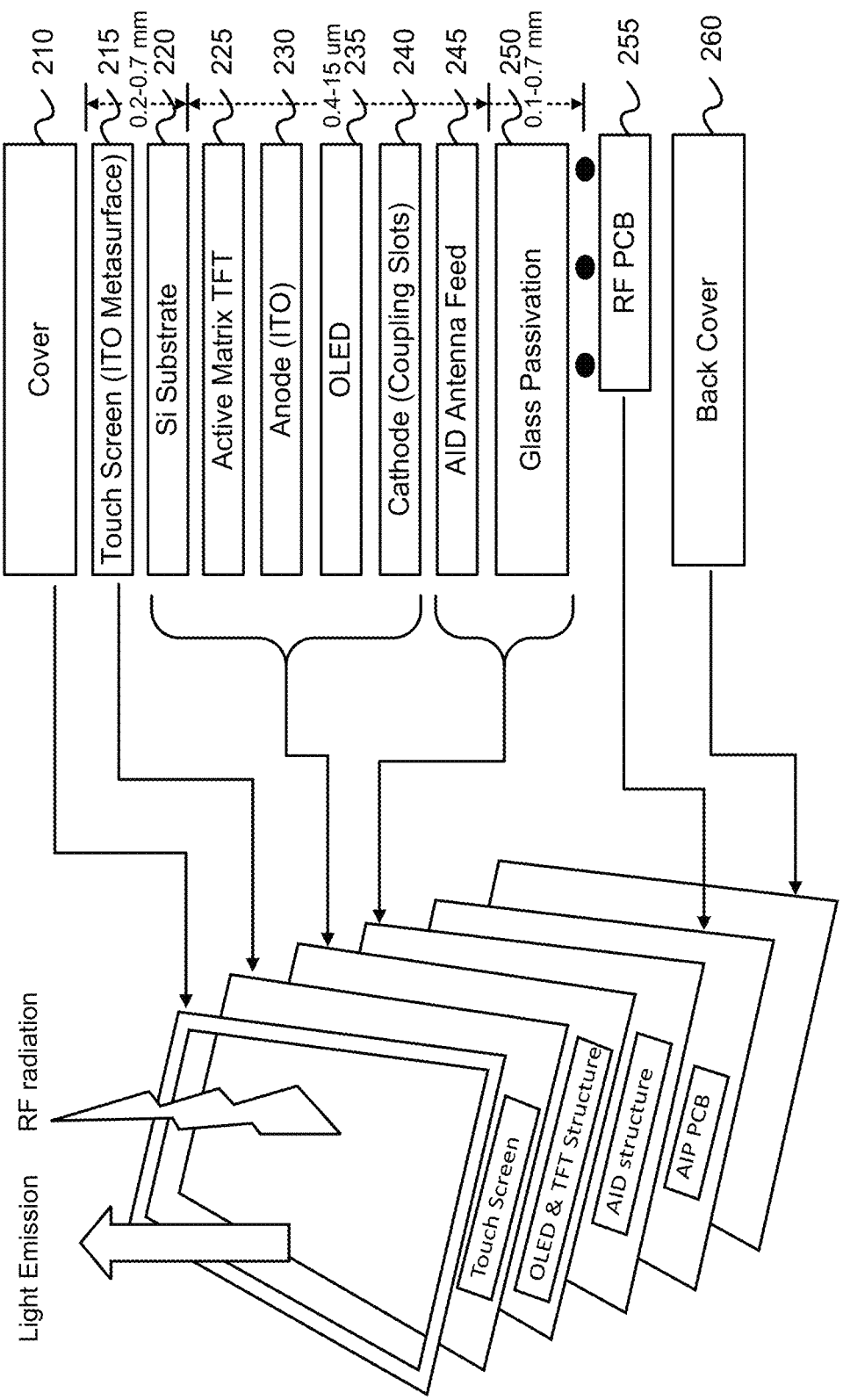
FIG. 2 - PRIOR ART -

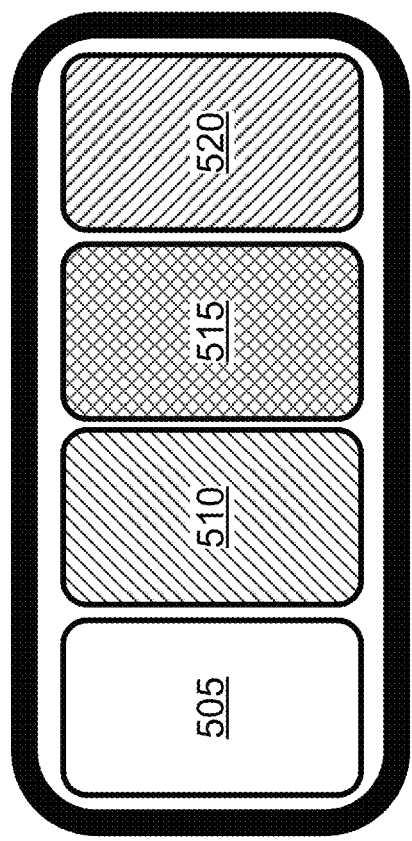

ANTENNA INTEGRATED DISPLAY SCREEN

CROSS-REFERENCE TO RELATED APPLICATIONS

This application claims benefit of priority to U.S. Provisional Patent Application Ser. No. 62/915,099 entitled "Antenna Integrated Display Screen" filed Oct. 15, 2019 the contents of which are hereby incorporated by reference in their entirety.

FIELD OF THE INVENTION

The present invention pertains to antennas, and in particular to antennas integrated with a display screen such as an organic light emitting diode (OLED) display screen of a mobile device or other electronic device.

BACKGROUND

It is anticipated that high-gain millimeter-wave and sub-millimeter-wave phased arrays will be incorporated as part of the future electronics and mobile devices such as 5G smart phones and laptops. These high frequency antennas are currently intended to be used mostly for high data-rate communications or near-range imaging. Antennas for such applications require relatively large aperture areas due to high antenna gain and wide-angle coverage requirements. Yet, most of the available real estate such as bezel area on a smart phone, for example, is already congested with multiple antennas for different types of communications bands. Therefore it is difficult to incorporate such antennas into devices, particularly when they are of limited size.

Currently, both organic light emission display (OLED) and liquid crystal display (LCD) remain in use. However, OLED is expected to surpass LCD technology in the near future. One type of OLED technology is referred to as active matrix OLED (AMOLED) technology. AMOLED is likely to be a preferred technology in future due to its superior color, contrast, low power and low cost.

As mentioned above, the area available for antennas in modern electronic devices is limited. Therefore there is a need to incorporate high frequency antennas into devices that obviates or mitigates one or more limitations of the prior art.

This background information is provided to reveal information believed by the applicant to be of possible relevance to the present invention. No admission is necessarily intended, nor should be construed, that any of the preceding information constitutes prior art against the present invention.

SUMMARY

An object of embodiments of the present invention is to provide an antenna and visual display apparatus, an antenna apparatus integratable with a visual display apparatus, a visual display apparatus integratable with an antenna apparatus, or a combination thereof.

According to embodiments of the present invention, there is provided an antenna and visual display apparatus. The apparatus includes an antenna feed layer comprising an array of antenna feeds for a corresponding antenna array. The apparatus further includes a visual display layer exterior and adjacent to the antenna feed layer. The visual display layer includes an array of light emitting diodes and control elements coupled thereto for operating the light emitting diodes to provide a visual display. The visual display layer further includes an array of apertures having sizing and spacing configured, according to an operating wavelength of the antenna array, to couple with respective ones of the antenna feeds to facilitate transmission of antenna signals (electromagnetic radiation) for the antenna array. The apparatus further includes an optically transparent substrate exterior and adjacent to the visual display layer. The apparatus further includes an array of conductive and optically transparent elements exterior and adjacent to the optically transparent substrate. The array of conductive elements is configured, for example through size, shape, spacing, or a combination thereof, to couple with the array of apertures to direct the antenna signals through the optically transparent substrate.

In various embodiments, the array of apertures is formed by omitting a subset of the array of light emitting diodes in an otherwise regular array. In some further embodiments, the array of light emitting diodes includes red, green, blue and white light emitting diodes, and omitting the subset of the array of light emitting diodes comprises omitting a subset of the white light emitting diodes. In other further embodiments, the array of light emitting diodes includes red, green and blue light emitting diodes, and omitting the subset of the array of light emitting diodes comprises omitting a subset of the green light emitting diodes.

In various embodiments, the array of conductive and optically transparent elements is a periodic array, with each conductive element being an electrically small patch (relative to operating wavelength). The patches may be rectangular, circular, elliptical, or cross-shaped, for example.

The array of apertures may be regarded as forming the primary radiating antenna elements of the antenna array. The array of apertures may be formed from slots in an anode conductive layer, a cathode conductive layer, or both, where the anode conductive layer and the cathode conductive layer are configured to electrically interact with the light emitting diodes for operation thereof. For example, the anode and cathode layers may be integral elements of an OLED display. The cathode conductive layer (or anode conductive layer, if the flow of charge is reversed) may be further configured to operate as a ground layer for the antenna array.

In various embodiments, the operating wavelength corresponds to an operating frequency which is between 10 GHz and 650 GHz. The operating frequencies may cover millimetre wave (mmWave) and THz frequencies. For example, the operating wavelength may be between 2.9 mm and 12.5 mm, or between 0.1 mm and 1 mm.

In various embodiments, at least the antenna feed layer is provided using an antenna-on-chip or an antenna-in-package structure. The antenna array may be configured for operation as a phased array. The antenna array may span an entire area of the visual display. The antenna array may span a region which is less than an entire area of the visual display, and said region is co-located with one or more edges of the visual display, or said region is co-located with a central portion of the visual display.

According to another embodiment of the present invention, there is provided a visual display apparatus. The display apparatus can exclude a corresponding antenna apparatus, however it can be operable such an antenna apparatus, in the sense that it permits and even potentially facilitates transmission of antenna signals (electromagnetic radiation) through itself. The apparatus can include a visual display layer comprising an array of light emitting diodes and control elements coupled thereto for operating the light emitting diodes to provide a visual display. The apparatus can further include an array of apertures formed in the visual display layer, the array of apertures having sizing and spacing configured, according to an operating wavelength of the antenna array, to: couple with a set of the antenna feeds to facilitate transmission of antenna signals for an antenna array. Additionally or alternatively, the array of apertures may have sizing and spacing configured for passing electromagnetic radiation at a predetermined operating frequency.

In some embodiments of the visual display apparatus, the array of apertures are formed by omitting a subset of the array of light emitting diodes in an otherwise regular array, for example by omitting white light emitting diodes or green light emitting diodes as with the antenna and visual display apparatus described above.

In some embodiments, the visual display apparatus further includes an optically transparent substrate exterior and adjacent to the visual display layer, and an array of conductive elements exterior and adjacent to the optically transparent substrate. The array of conductive elements have sizing and spacing configured to couple with the array of apertures to direct the antenna signals through the optically transparent substrate. In some embodiments, the array of conductive elements is configured to operate as components of a touch-sensitive control surface user interface. In some embodiments, the array of conductive elements is integrated with a touch-sensitive control surface user interface.

According to another embodiment of the present invention, there is provided an antenna apparatus, which may be operable and integratable with a visual display, without necessarily including the components of the visual display. The antenna apparatus includes an antenna feed layer comprising an array of antenna feeds for a corresponding antenna array. The antenna apparatus further includes a substrate exterior to the antenna feed layer. The antenna apparatus further includes an array of conductive and optically transparent elements exterior and adjacent to the optically transparent substrate, the array of conductive elements having sizing and spacing configured to couple directly or indirectly with the array of antenna feeds to direct antenna signals through the substrate.

In various embodiments of the antenna apparatus, the substrate is optically transparent. In various embodiments, the antenna apparatus further includes a visual display layer between the antenna feed layer and the substrate. The visual display layer includes an array of light emitting diodes and control elements coupled thereto for operating the light emitting diodes to provide a visual display. The visual display layer includes an array of apertures having sizing and spacing configured, according to an operating wavelength of the antenna array, to couple with respective ones of the antenna feeds to facilitate transmission of antenna signals for the antenna array.

In various embodiments of the antenna apparatus, the array of conductive and optically transparent elements is configured to operate as components of a touch-sensitive control surface user interface. In some embodiments, the array of conductive elements is integrated with a touch-sensitive control surface user interface.

In various embodiments of the antenna apparatus, the substrate is electrically or electromagnetically thick, for example silicon material, with high permittivity. This may cause the substrate to be lossy and directive. In various embodiments, the antenna apparatus further includes an array of primary radiating antenna elements located between the antenna feed layer and the substrate. In various embodiments, the primary radiating antenna elements are slots or dipoles. The slots or dipoles may be electrically small, having an electrical length which is less than half of a free-space operating wavelength of the antenna array. In various embodiments, each of the conductive elements is electrically small, for example having an electrical length of approximately or less than one quarter of a free-space operating wavelength of the antenna array. The conductive elements may be rectangular patches, circular, elliptical, or cross-shaped dipoles, for example.

Embodiments have been described above in conjunctions with aspects of the present invention upon which they can be implemented. Those skilled in the art will appreciate that embodiments may be implemented in conjunction with the aspect with which they are described, but may also be implemented with other embodiments of that aspect. When embodiments are mutually exclusive, or are otherwise incompatible with each other, it will be apparent to those skilled in the art. Some embodiments may be described in relation to one aspect, but may also be applicable to other aspects, as will be apparent to those of skill in the art.

BRIEF DESCRIPTION OF THE FIGURES

Further features and advantages of the present invention will become apparent from the following detailed description, taken in combination with the appended drawings, in which:

FIG. 2 illustrates a general antenna in display in a smart phone structure, in accordance with embodiments of the present invention.

FIG. 5 illustrates an RGBW sub-pixel scheme, comprising red, green, blue and white sub-pixels.

It will be noted that throughout the appended drawings, like features are identified by like reference numerals.

DETAILED DESCRIPTION

Figure 1A:
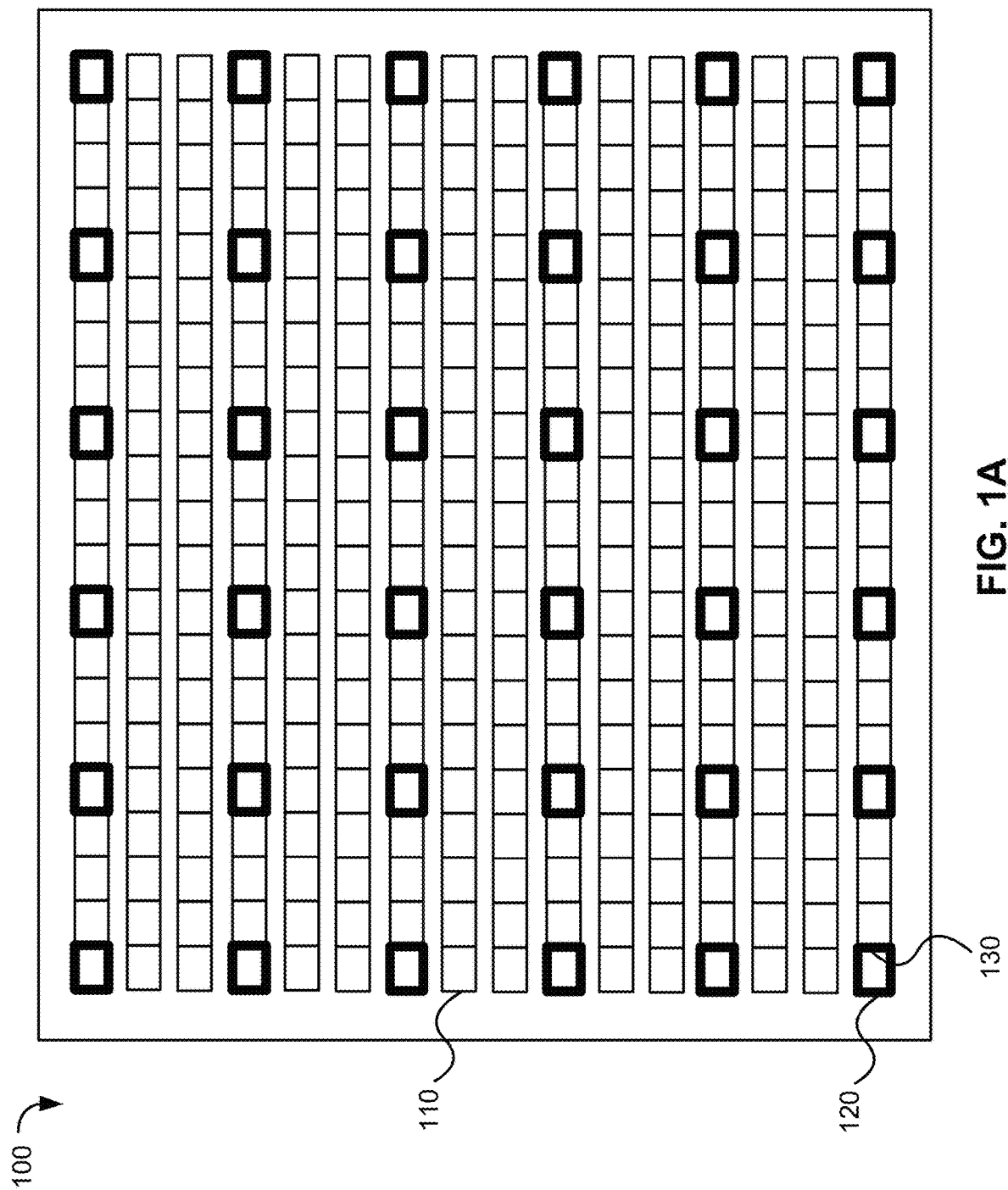
FIG. 1A illustrates a visual display including an array of periodic apertures and matching metasurfaces, in accordance with embodiments of the present invention.

As used herein, the term "about" should be read as including variation from the nominal value, for example, a +/−10% variation from the nominal value. It is to be understood that such a variation is always included in a given value provided herein, whether or not it is specifically referred to.

Embodiments of the present invention provide an OLED In-Display Antenna. The proposed in-display antenna concept is achieved through an integration of antenna technologies with an LED display such as an Active Matrix Light Emission Display (AMOLED). Although the focus herein is on AMOLED displays, other types of LED displays can be used, such as other OLED displays, particularly passive matrix organic light emitting diode (PMOLED) displays. The antenna technologies may be millimeter-wave, Terahertz, or a combination thereof. The Terahertz frequency antenna may be used for near-range imaging, for example. Embodiments may be capable of resolving current issues related to 5G communication system requirements and antenna congestion due to limited real estate on devices such as mobile electronic devices. An array of LEDs, LED displays, and OLED (OLED can include AMOLED and PMOLED) displays can be included in the visual display layer of embodiments of the present invention along with control elements to operate the array of LEDs, LED displays, and OLED displays to provide a visual display.

Embodiments or the present invention enable concurrent transmission of optical display signals and high-frequency (mm-wave and THz) RF data through a common display screen area. Some such embodiments enable transmission of a high-data-rate, steerable, high-gain RF beam through a large display screen area with limited to no interference from optical display components, or with causing of limited to no interference to the normal function of the optical display.

Embodiments of the present invention provide an antenna and visual display (antenna-in-display) apparatus, in which an antenna structure co-exists with and is integrated within a visual display such as an AMOLED display. The antenna can be an array operating at mmWave frequencies, THz frequencies, or both, which are considered radio frequencies for purposes of the instant application. Both RF and light emission may be transmitted through an optically transparent anode layer (conductive indium tin oxide (ITO)), TFT thin film structure, and a thick glass substrate. The metallic cathode of the OLED display may also be used as ground layer for the RF section. RF radiators may be integrated into the OLED structure using existing AOC and AIP technologies. RF beams may be steerable using a phased array method. For mmWave high-data-rate transmission, arrays of this type may be disposed along edges of a visual display or corresponding device such as a smart phone. For other applications such as THz imaging, the array may be applied to a central portion, and potentially the entirety, of the display area.

Embodiments of the present invention provide for a modified color sub-pixel scheme capable of allowing integration of a high-frequency RF and light emission structure. The scheme may be a modified RGB or RGBW scheme. The modified sub-pixel scheme allows direct integration of RF radiators with OLED structure without affecting the color pixel of light emission. In particular, the modified sub-pixel scheme can involve omitting a subset of sub-pixels to form apertures which are aligned with RF feeds of an antenna array. The apertures, when formed in one or more layers of conductive material, may thus form slot-like radiating antenna bodies. In some embodiments, a subset of white (W) sub-pixels may be omitted. In some embodiments, a subset of green (G) sub-pixels may be omitted. This may involve providing two green sub-pixels into every pixel, and only omitting one of the two green sub-pixels. Other arrangements are possible, for example other colours of sub-pixels may be omitted, or sub-pixels of multiple colours may be omitted, for example alternatingly.

Embodiments of the present invention provide for a high-gain, wide-angle scanning, short-slot antenna array with matching metasurface. This approach makes use of a metasurface to transform a relatively inefficient RF radiating environment into a more efficient radiating structure with relatively wide scan angle. The radiating structure makes use of short radiating slots (electrical length less than $\lambda/2$, where $\lambda$ is an antenna operating wavelength) by taking advantage of high directivity and thickness of an outer substrate, e.g. thick glass or other substrate with high permittivity. A metasurface comprising electrically small patches (electrical length less than $\lambda/4$) is placed at the air-substrate interface to achieve high radiation efficiency. Metallic pattern on this metasurface may also function as part of a touch screen of the device. An electrically small (e.g. electrically short) component may be defined as a component which has a physical size aspect which is significantly smaller than an operating wavelength of a signal which it is configured to operate upon. For example, the component may have one or more relevant dimensions (e.g. length, width and thickness) which is less than one quarter of the operating wavelength.

In some embodiments, rather than using slot-type radiators, an alternative type of radiator may be used. For example, the slot radiators may be replaced with electrically short dipoles. The dipoles may be formed (e.g. printed) on the same layer as the RF feed, for example on the top metallic layer in the back end of line (BEOL). The matching metasurface with electrically small patches of a given shape may be provided, and tuned to the dipole radiators in a similar manner as is done with the slot radiators. The electrically short dipoles can have an electrical length that can be less than half of a free-space operating wavelength of the antenna array because the physical size of the electrically short dipoles is significantly smaller than the operating wavelength of the signal.

According to various embodiments, electromagnetic power (antenna signal) is initially coupled from an RF feed system through a glass or Si substrate using a short radiating slot disposed in visual display layers, such as cathode, anode and OLED layers of a visual display. As such, these functional layers of the visual display may also incorporate antenna components. To inhibit the RF power from being absorbed and dissipated by the glass or Si substrate, an impedance matching metasurface is disposed on the outer surface of the substrate. The metasurface cooperates with the slot radiators and anode layer as a coherent matching structure to facilitate radiation of the electromagnetic power outward from the device (for transmitting antennas). The short slot may be considered an antenna radiating element, while the matching metasurface, in conjunction with the anode surface, operates as a radiation enhancement structure.

Figure 1B:
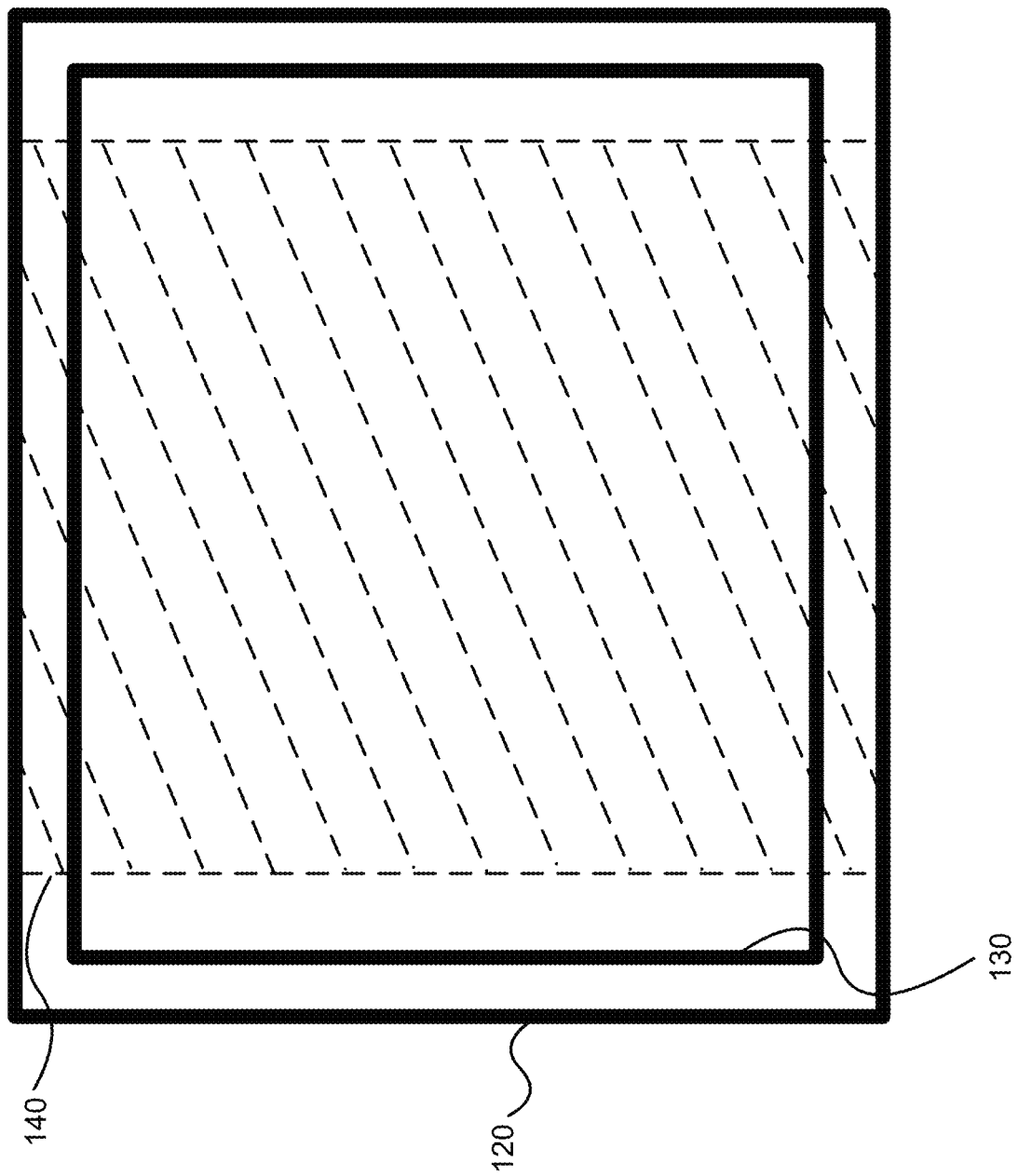
FIG. 1B illustrates an aperture, RF patch, and antenna feed, in accordance with embodiments of the present invention.

FIG. 1A illustrates a visual display 100 that can include an antenna apparatus where the antenna is integratable with the visual display, the visual display is integratable with the antenna, or a combination thereof. The visual display can also exclude the corresponding antenna apparatus and be operable with an antenna apparatus by facilitating transmission of RF energy through itself. The visual display and antenna apparatus can include a plurality of light emitting diodes 110 (e.g. OLEDs), an array of periodic apertures 120, and also a matching metasurface comprising an array of RF patches 130. FIG. 1B illustrates an enlarged view of aperture 120, RF patch 130, and antenna feed line 140. Antenna feed line 140 can include an array of antenna feeds (not shown). Since a visual display layer of the visual display can be exterior and adjacent to antenna feed line 140, aperture 120 can be included to couple with respective antenna feed line 140 to facilitate RF energy radiation. A plurality of apertures 120 organized in a regular pattern as an ordered series can comprise an array of apertures formed in the visual display layer. The array of apertures can be sized and spaced to allow for antenna feed coupling. For example, the apertures can be aligned with the antenna feeds in the array of antenna feeds. The apertures can have a size which allows them to pass or direct electromagnetic energy. In this regard, the apertures can be sized to act as reflecting or directing slot electromagnetic elements.

More RF energy can radiate from antenna feed line 140 and couple with the optically transparent substrate as the number of apertures 120 that comprise the array of apertures is increased. Aperture 120 of the array of apertures can be formed by omitting a subset of the array of light emitting diodes from the otherwise regular array of light emitting diodes. Aperture 120 of the array of apertures can also be formed from slots in one or both of the anode conductive layer or cathode conductive layer that electrically interact with light emitting diodes 110. The size of apertures 120 and spacing between apertures 120 can be configured according to the operating wavelength of antenna feed line 140 that comprise the antenna array. The configuration of the size and spacing of apertures 120 to couple with respective antenna feed line 140 can be adjusted to facilitate transmission and/or reception of RF energy to/from antenna feed line 140 comprising the antenna array. In a conventional phased array, the more closely the size and space of apertures 120 are configured to match the operating wavelength, the more RF energy can radiate from antenna feed line 140. In contrast, in embodiments of the present invention, radiation apertures are kept to relatively small sizes compared to operating wavelength to facilitate wide beam scanning. For example the aperture size can be less than a quarter of the operating wavelength. RF patches 130 serve to couple with aperture 120 and assist in directing RF energy radiation through an optically transparent substrate that can be exterior and adjacent to the visual display layer. The optically transparent substrate can be, for example a glass or other transparent material which overlays and protects the visual display layer. It also provides a separation distance so that the matching metasurface can be provided at a desired distance from the antenna feed layer and visual display layer.

Since a significant amount of area of many handheld devices can be comprised of a visual display, embodiments of this invention provide a visual display adapted for cooperation with one or more antennas included in the antenna array of the handheld device. This cooperation can result in an increase in the amount of RF energy that can be transmitted and/or received by antennas included in handheld device without the resolution of the visual display being reduced by an amount detectable by the user of the handheld device. The visual display is configured (for example as described above) for cooperation with the antenna apparatus by allowing and even assisting with the transmission of RF energy through same. This may include provision of a matching metasurface in the visual display, the inclusion of apertures in the visual display for passing RF energy, or the like. The apertures may be provided by omitting certain light emitting diodes, and adjusting the visual display to compensate for the omission. Other integrations can also be performed, for example re-using a suitable layer of the OLED structure as an antenna ground plane. A non-limiting example of re-using a suitable layer of the OLED structure can include further configuring the cathode conductive layer to operate as a ground layer for the antenna array. According to various embodiments, an antenna array which is configured to be provided in a plane parallel to a visual display, and adapted to transmit RF energy through the visual display, is similarly provided. According to various embodiments, an apparatus comprising both an antenna array and visual display are provided.

FIG. 2 illustrates a general antenna in display (AID) in a smart phone structure. Multiple high-frequency planar antennas can be integrated with the OLED 235 structure using the antenna-on-chip (AOC) and Silicon CMOS technologies. RF connections to AID radiators can be fed by board metal traces through standard wire-bond or flip-chip connections at the back-end of the device. The resultant AID display structure is substantially transparent to both light emission and high-frequency electromagnetic transmissions at least in given frequency bands. The OLED 235 structure comprises complex materials, including the color emitters, conductive indium tin oxide (ITO) anode and metallic cathode layers, active matrix transistors layer and silicon substrates.

FIG. 2 illustrates substantially all relevant layers of a smart phone device from front to back cover. Other figures described herein illustrate a limited number of these layers, which may be a subset of the layers shown in FIG. 2.

As will be readily understood, OLED 235 uses a voltage differential between cathode 240 and anode 230 layers to drive a color pixel. The cathode 240 may be complete metallic (e.g. aluminum) and the anode 230 may be optically transparent, for example formed from ITO.

In more detail, an antenna-in-package (AIP) printed circuit board (PCB) 255 containing radiofrequency type antenna components is provided in an interior of the device. As used herein, radiofrequency (RF) includes mmWave and THz frequency ranges. Exterior to the AIP PCB (with the top cover of the device representing the outermost location) is an (antenna in display) antenna feed layer 245. The antenna feed layer 245 is electrically coupled to the AIP PCB 255. A glass passivation layer 250 is located between the PCB 255 and antenna feed layer 245. A silicon substrate 220 may be provided adjacent and exterior to the antenna feed layer 245. Adjacent and exterior to the antenna feed layer 245 is the OLED 235 and associated thin-film transistor (TFT) 225 display structure. This can include an active matrix TFT 225 control layer (e.g. including transistors and control lines), a cathode layer 240, a layer containing colored OLEDs 235, and an ITO anode layer 230. The cathode layer 240, anode layer 230, or both can include apertures (e.g. RF coupling slots) formed therein which are configured to operate as part of the antenna array by allowing RF energy to couple between the antenna feed layer 245 and an exterior of the structure. Adjacent and exterior to the anode layer 230 is the (active matrix) TFT display structure layer 225. Adjacent and exterior to the TFT display structure layer 225 is a silicon substrate layer 220. Adjacent and exterior to the silicon substrate layer 220 there may be provided a touch screen layer 215 which may additionally or alternatively act as an impedance-matched metasurface. This metasurface comprises an array of conductive elements such as patches which assist in directing the RF energy. A front cover 210 is formed overtop of the touch screen/metasurface layer 215. RF energy is directed through the OLED 235 and front cover 210. The conductive elements of the matching metasurface are optically transparent, so as not to impede use of the visual display which is located underneath same. The conductive elements electromagnetically couple with the antenna elements and array of apertures associated with same.

The antenna feed layer 245 can include an array of antenna feeds that can be connected with one or more radiating elements to comprise an antenna array. The radiating element can be used to radiate RF energy and the RF energy can couple with the exterior of the structure. The array of antenna feeds can also be used to convert the impedance of RF PCB 255 to match the intrinsic impedance of the radiating element. The array of antenna feeds can also be used to make balanced-to-unbalanced conversions between RF PCB 255 and the radiating element.

In embodiments of the present invention, the array of primary radiating antenna elements can be located between the antenna feed layer and the substrate.

Figure 3:
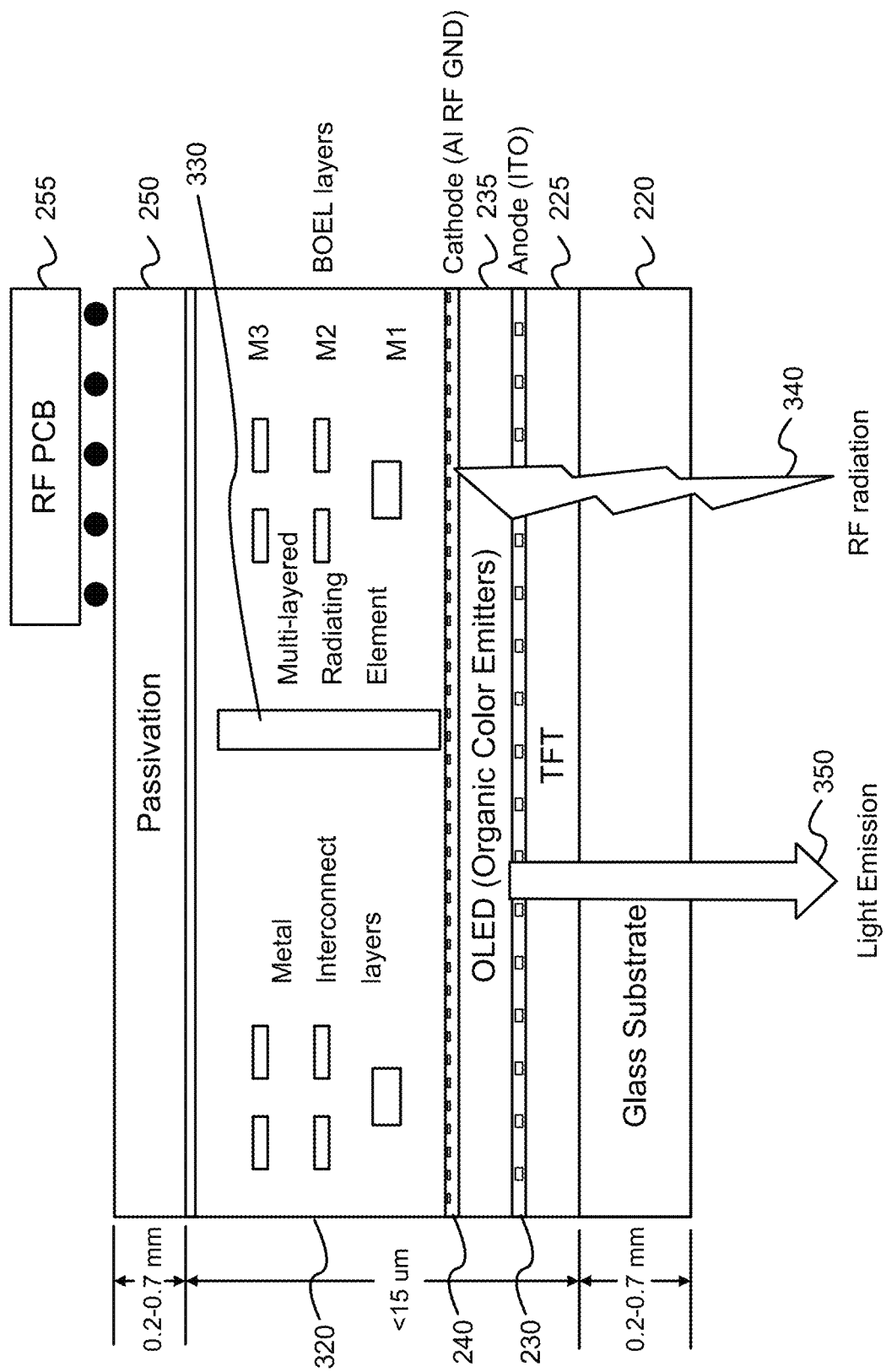
FIG. 3 illustrates, in cross-section, an antenna in display apparatus using a bottom-emitting AMOLED display pixel structure, according to an embodiment of the present invention.

FIG. 3 illustrates, in cross-section, an AID apparatus using a bottom-emitting AMOLED display pixel structure, according to an embodiment of the present invention. Except for the multi-layered metallic antenna structure, all high-frequency RF components are to be mounted on an external RF PCB 255. Note that the total thickness of the OLED 235 and TFT layers 225 are typically less than 0.4 µm. The thickness of the base Si substrate 220 is less than 500 µm. Total thickness of the device is in the order of 1 mm. FIG. 3 illustrates the RF (AIP) PCB 255, a passivation layer 250, and metallic interconnect layers 320. These interconnect layers 320 may include multi-layered RF radiating elements 330, for example. An OLED layer is located exterior and adjacent to the metallic interconnect layers 320. The OLED layer includes cathode layer 240, OLED layer 235, and anode layer 230, along with a TFT control layer 225 located exterior to the anode layer 230. The cathode layer 240 may also act as an RF ground layer. Apertures may be formed in the cathode 240, OLED 235 and anode 230 layers. Exterior and adjacent to the OLED layer 235 is a glass substrate layer 220. Exterior and adjacent to the glass substrate layer 220 may be a matched metasurface layer (not shown).

In the bottom-emitting AMOLED configuration of FIG. 3, colored spectrum is emitted through a highly transparent ITO anode 230, TFT structure 225 and glass substrate 220 through the bottom side of a wafer. A metallic cathode 240 is deposited on top of the OLED structure 235. This metallic layer 240 is also used as an RF ground layer for AID RF elements. Multi-layered radiating antenna elements are then built with interconnecting metallic layers 320 in the back-of-the-line (BOEL) using AOC technology. RF feeds and external RF sources are interconnected to the AID antenna using the AIP technique, which is a recently developed technology for integrating a highly integrated radio die into a standard surface mounted chip-scale packaged device. In this concept, high-frequency EM radiation 340 is transmitted to free-space at the bottom (same direction as the light emission) through the OLED layer 235, the optically transparent ITO anode 230, and the CMOS TFT layer 225. The colored spectrum emitted through the anode 230 is light emission 350. The EM radiation may be at radio frequency (RF).

Some EM openings are provided in the visual display (OLED) layer 235 to allow efficient EM radiation 340. Because the frequency of EM transmission is significantly lower than that of light emission 350, it is not required to have an EM opening in every single color pixel of the visual display. Furthermore, it may be desired to limit or minimize the number of these opening to preserve quality of the display, e.g. the quality of pixel color.

The frequency of the EM openings (i.e. related to the spacing of openings) in the visual display layer is determined based on the operating wavelength of the RF radiation 340. Table 1 gives an estimate of operating wavelength in a glass-filled silicon material with effective relative dielectric constant of 4.5.

TABLE 1

| Frequency (GHz) | Free-space $\lambda$ (mm) | Free-space $\lambda/2$ (mm) | $\lambda/2$ in Glass (mm) |
| --- | --- | --- | --- |
| 24 | 12.5 | 6.25 | 2.95 |
| 28 | 10.7 | 5.35 | 2.52 |
| 39 | 7.7 | 3.85 | 1.81 |
| 58 | 5.2 | 2.60 | 1.23 |
| 70 | 4.3 | 2.15 | 1.01 |
| 94 | 3.2 | 1.60 | 0.75 |
| 100 | 3.0 | 1.50 | 0.71 |

Figure 4A:
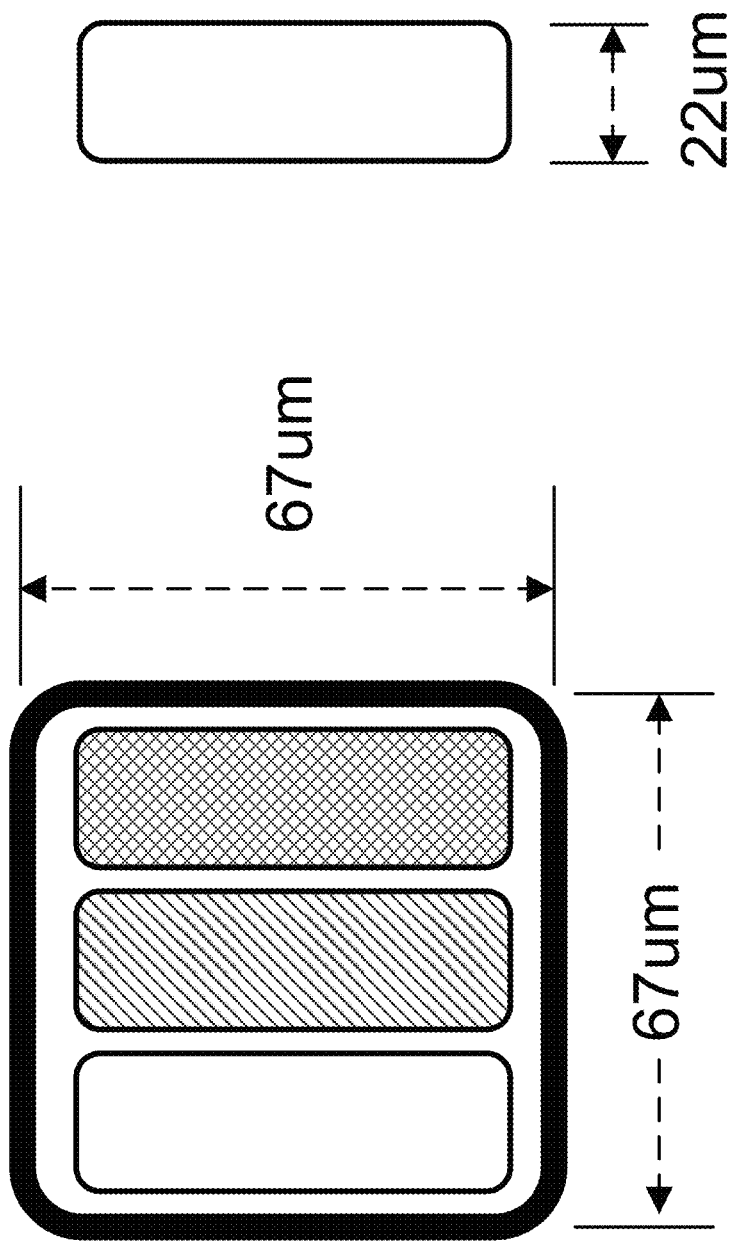
FIG. 4A shows dimensions of a typical high resolution colour RGB sub-pixel OLED.

The actual frequency of EM openings, in terms of numbers of pixels of the display, also depends on resolution of the display. A color pixel can have a typical dimension of between 14 µm to 56 µm, depending on the actual resolution. Today's typical smart phone has a high-resolution screen with typical 400 to 450 ppi. As such, each color pixel size is between 24 to 22 µm, or a three-color pixel size of 72 µm to 66 µm. FIG. 4A shows dimensions of a typical RGB sub-pixel OLED with aspect ratio of 16:9. This is a typical case of 1920×1080 pixels with 450 ppi resolution. Each color pixel is 22 µm in width and about 67 µm in height, with three color pixels per three-color pixel.

In a conventional RGB scheme, all three color sub-pixel assumes equal size.

However, in this form, no EM radiation through the OLED structure is possible (without removing pixels). FIG. 5 illustrates an alternative RGBW sub-pixel scheme, comprising red 505, green 510, blue 515 and white 520 sub-pixels. In this case the white "W" sub-pixel 520 can be used for occasional EM coupling where required. That is, some of the white sub-pixels in the OLED structure can be omitted, for example according to a periodic grid aligned with RF feeds. In that case, the color pixel aligned with an EM feed can be treated as a regular RGB pixel because only the "W"

sub-pixel is omitted. However, the RGBW scheme suffers from 25% lower resolution compared to a regular RGB scheme.

Figure 4B:
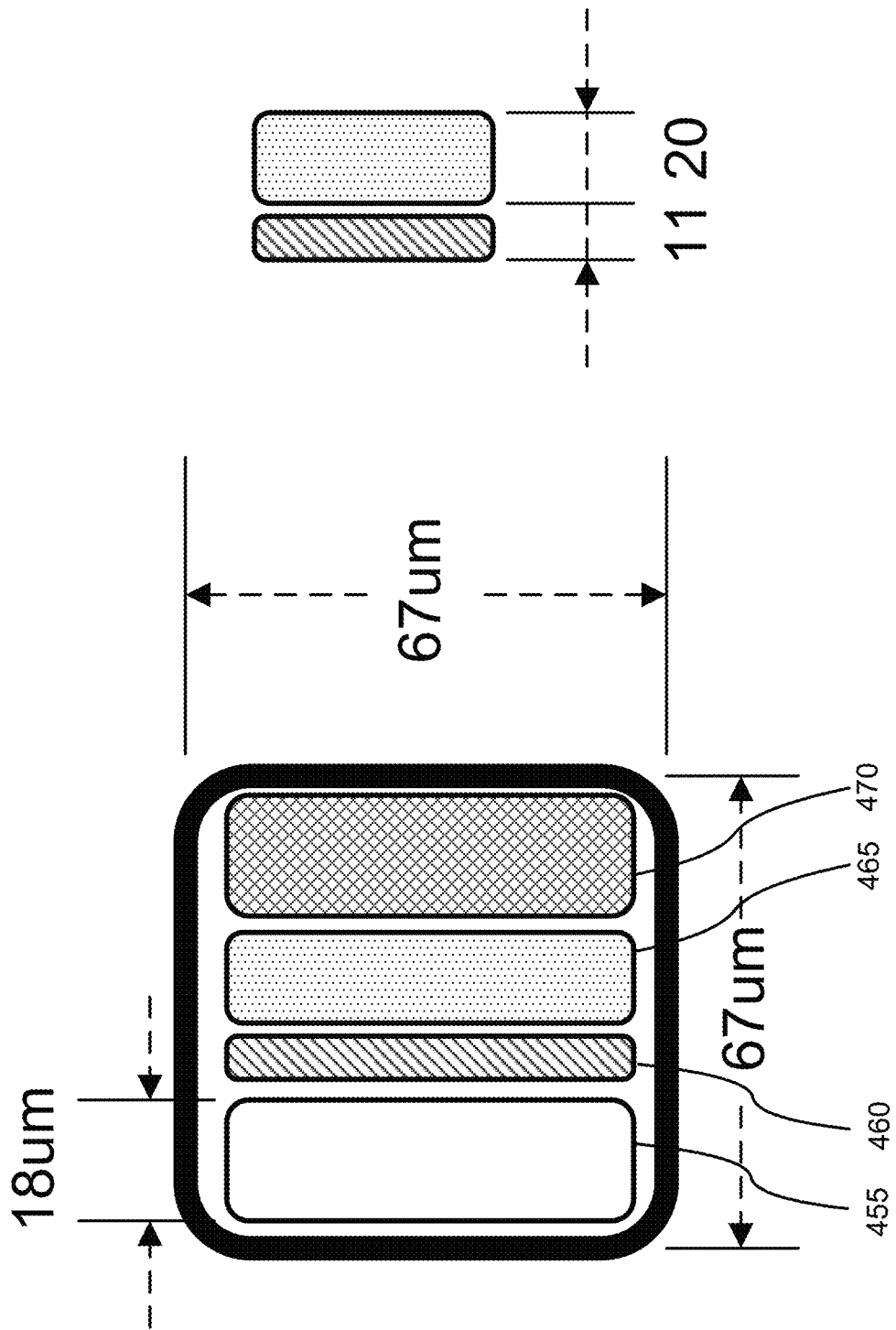
FIG. 4B shows an alternative of modified RGB sub-pixel scheme, according to an embodiment of the present invention.

To achieve higher resolution without significant loss of color quality, FIG. 4B shows an alternative modified RGB sub-pixel scheme. Here, it is proposed that the green color sub-pixel be split into two smaller cells (sub-pixels) 460, 465. One of the two green cells 460, 465 in a given pixel can then be omitted. Red 455 and blue 470 cells are also shown. This may occur in only some of the pixels in the OLED structure, for example according to a periodic grid aligned with RF feeds. This allows for omission of one of the two green cells (460 or 465) where EM coupling is needed. This approach is based on the assumption that degradation to the overall display quality is limited by omission of green sub-pixels, due to higher sensitivity of human eye to the green color and lower frequency of RF radiation. In width, pixel 455 is about 18 µm, sub-pixel 460 is about 11 µm and sub-pixel 465 is about 20 µm. The pixels are about 67 µm in height.

Figure 6:
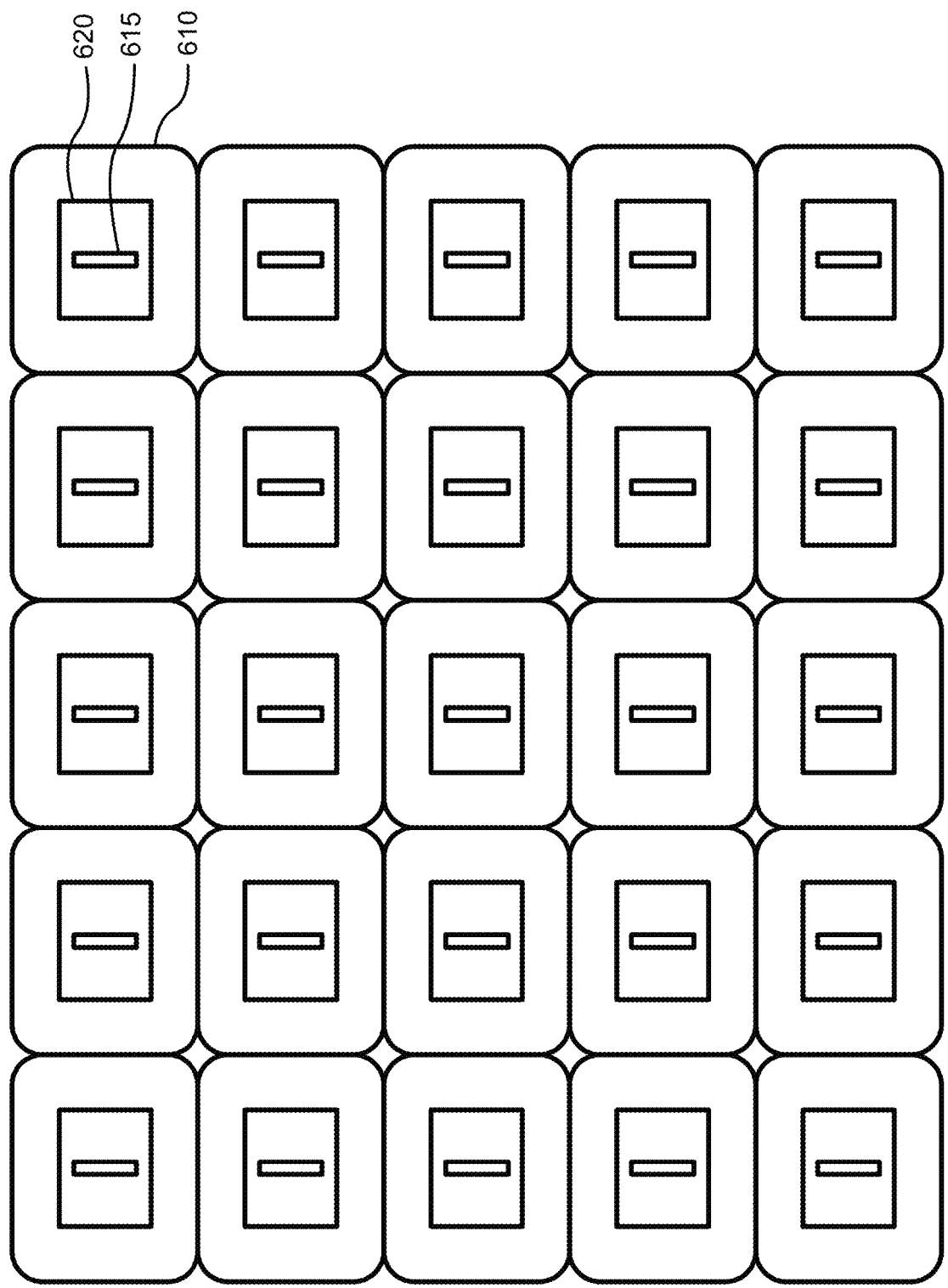
FIG. 6 shows an arrangement of a millimetre wave in-display phased array, according to an embodiment of the present invention.

FIG. 6 shows a possible arrangement of a mmWave AID phased array using this color sub-pixel scheme. In this case, the array spacing assumes 2.4 mm for center frequency of EM radiation near 60 GHz. Each RF cell spans over 36 color pixels. In more detail, FIG. 6 shows a 5×5 arrangement of RF cells 610 aligned with a 180×180 arrangement of color pixels. Each RF cell includes a slot radiator 615 aligned with a patch 620 for example formed of ITO material on a matching metasurface. Between the slot radiator and the patch are a layer of glass. The slot radiator may be formed in anode and cathode layers of the OLED display and fed by an underlying RF feed structure. Although not shown, a rectangular grid array of 36 pixels wide by 36 pixels high is disposed overtop of each RF cell 610. Generally, although rectangular grids of RF cells and pixels are specified, other regular or irregular geometries of RF cells and pixels (e.g. hexagonal grids) can be used.

Figure 7:
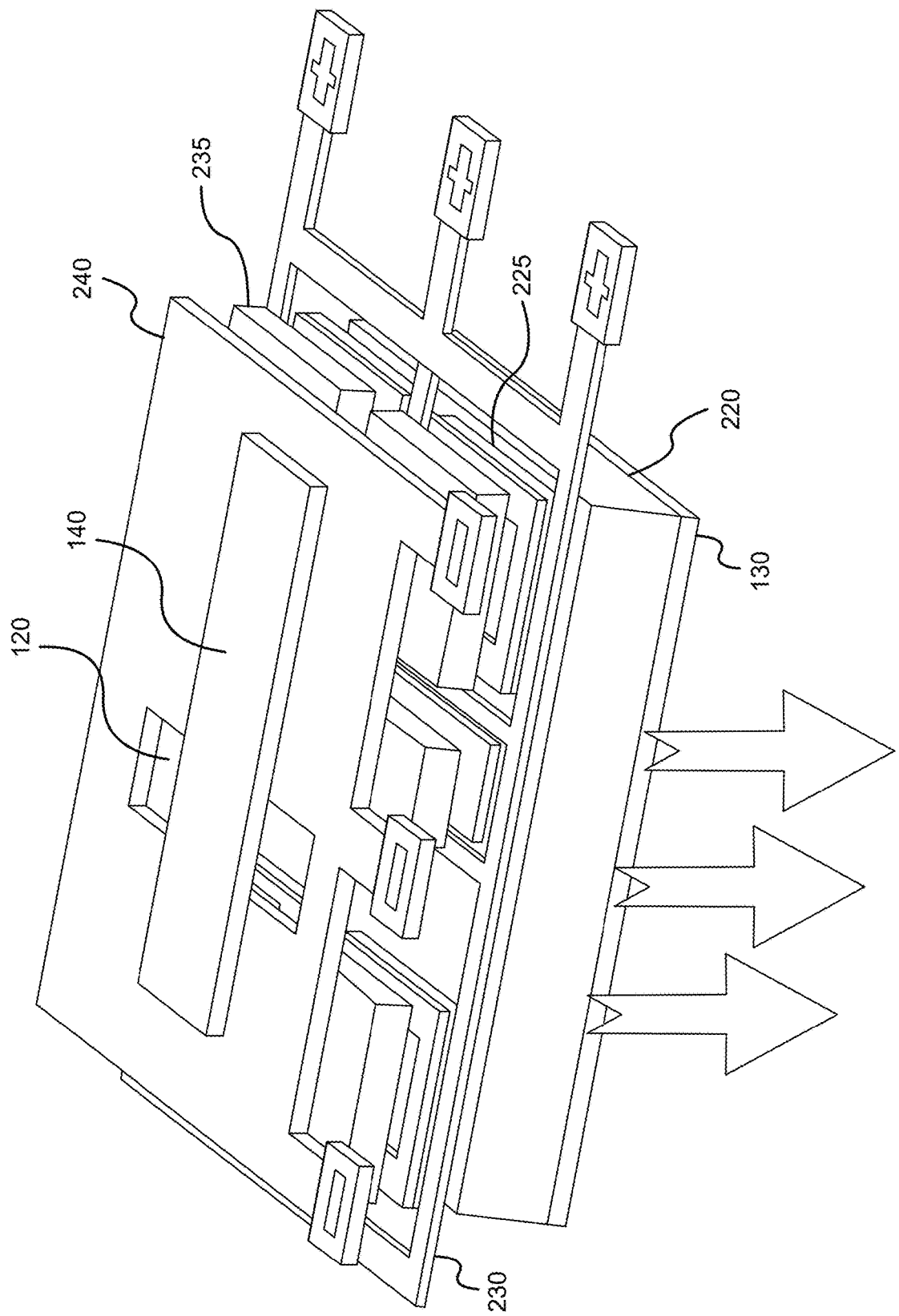
FIGS. 7 and 8 show an example of a color-pixel unit cell of an antenna in display pixel using a coupling slot in the cathode layer of the OLED structure, according to an embodiment of the present invention.
Figure 8:
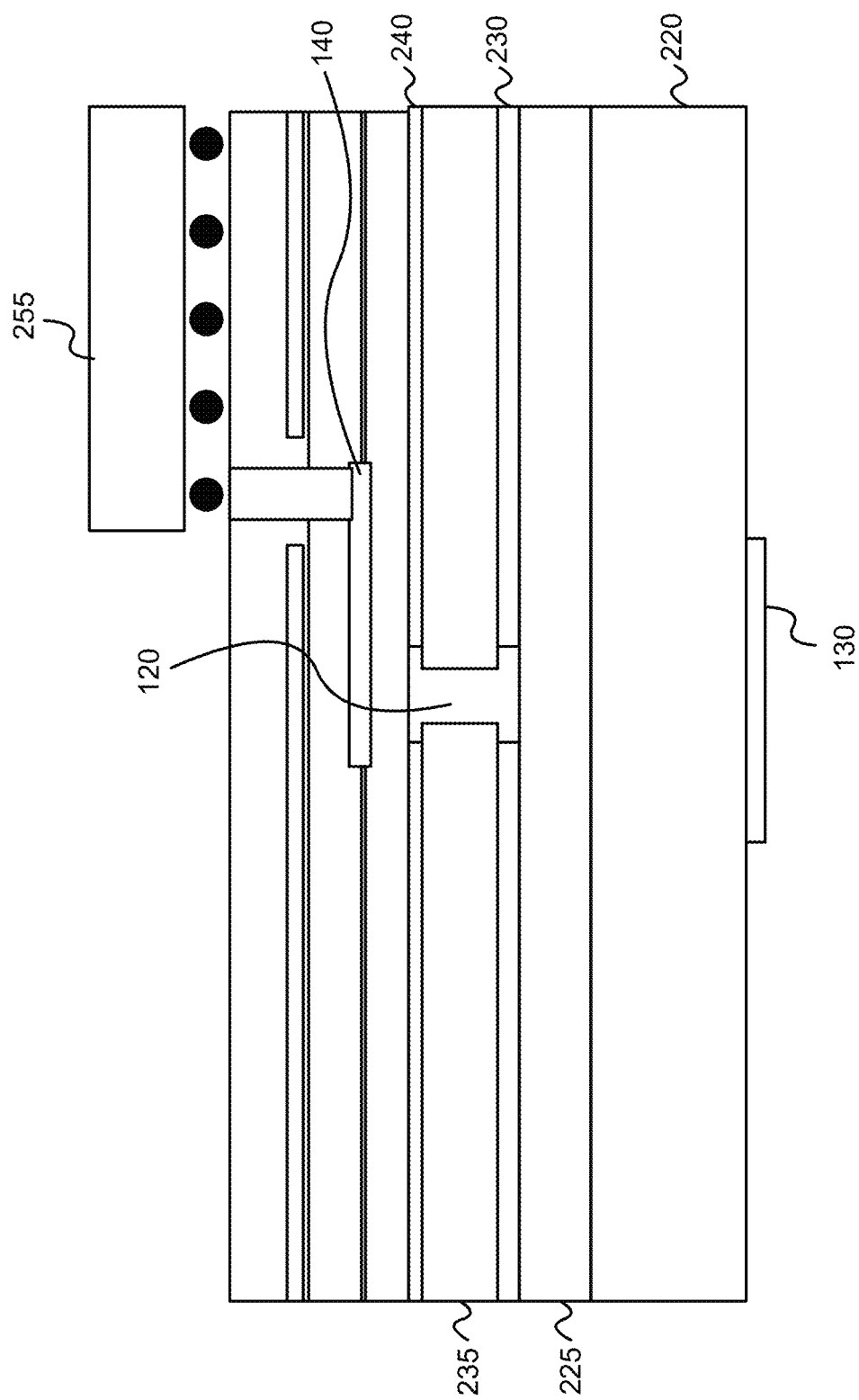

In general, an aperture such as radiating slot may be provided in the OLED structure, including in the OLED and anode layers thereof. Apertures can act as antenna radiating bodies as will be readily understood by a worker skilled in the art. FIGS. 7 and 8 show an example of a color-pixel unit cell of an AID pixel using a coupling slot 120 in the cathode layer 240 of the OLED structure 235. As shown in FIG. 7, a portion of a "Green" sub-pixel including the TFT matrix 225 and anode patches 230, which are (or which would otherwise be) aligned with the coupling slot 120, are also omitted. The resulting space may be left empty or filled with RF material to allow efficient EM radiation through the OLED structure. A coupling slot thus is also formed in the OLED material and anode layers, which enables EM coupling of RF power from RF feed line 140 to glass substrate 220 and free-space at the bottom of the figure. Although some EM power may be lost in the lossy OLED material, it is expected that most of the RF power will be coupled through the narrow slot 120 because the overall thickness of the OLED material is less than 0.1 µm. As such, RF power can be effectively fed from the top feed line 140 to the glass substrate 220 at the bottom. However, due to thickness and high permittivity of the glass substrate, RF signal tends to be mostly trapped and lost in the glass substrate. To mitigate this, a boundary matching layer (matching metasurface) is provided at the air-glass interface. This matching layer includes an RF patch 130 which is aligned and electromagnetically couples with the coupling slot 120 in order to direct wireless signals (electromagnetic radiation) through the glass substrate 220. Details of this configuration will be provided below.

Glass substrate 220 can be an optically transparent substrate that can be exterior and adjacent to TFT layer 225 (TFT layer 225 can be included in the visual display layer) and can also be exterior to the antenna feed layer. The matching layer may include a matching metasurface layer that can comprise one or more RF patches 130 organized as or aligned with an array of apertures where the RF patches 130 can be electrically small because the RF patches 130 may have one of more relevant physical dimensions (e.g. length, width and thickness) which is less than one quarter of the operating wavelength. Metasurface layer and RF patches 130 thereof can be conductive and optically transparent elements that can be exterior and adjacent to the optically transparent substrate (glass substrate 220). The array of antenna feeds can be configured to couple directly or indirectly with the RF patches 130 to direct radiated RF energy through the optically transparent substrate. A non-limiting example of a configuration of conductive and optically transparent RF patches 130 can include the size and shape of the conductive and optically transparent RF patches 130 and also the spacing of the conductive and optically transparent RF patches 130 to direct radiated RF energy through the optically transparent substrate. The optically transparent substrate can be electromagnetically thick with high permittivity.

Embodiments of the present invention can include conductive and optically transparent elements (non-limiting examples of conductive and optically transparent elements can include elements of a metasurface layer such as RF patches 130) that can be integrated in a touch-sensitive control surface user interface. Some or all of the conductive elements can be electrically small because the conductive elements may have one of more relevant dimensions (e.g. length, width and thickness) which are less than one quarter of the operating wavelength.

FIG. 8 illustrates a similar layout to FIG. 7, including RF feed line 140 coupled to a RF PCB 255 through a passivation and ground layer, a coupling slot 120 formed in a cathode 240 and/or anode layer 230 of the OLED structure 235, a gap in the OLED layer which is free of OLEDs, a TFT matrix layer 225, a glass substrate 220, and an RF patch 130. Also notable is the RF ground layers on both sides of the RF feed line 140, where one of the RF grounds can also function as the cathode layer 240 of the OLED structure. Forming the gap in the OLED layer may comprise omitting part of an OLED pixel, for example a green or white sub-pixel.

Embodiments of the present invention provide for an antenna array for high-data-rate communication, for example in a 5G wireless communication environment. The antenna array can be integrated into a mobile device, UE terminal, smart phone. The antenna array can be configured to produce a relatively high-gain, steerable beam with a wide scan angle from the front to the back of the device. The antenna array can be provided as an array of short radiating slots coupled with a matching metasurface. Further details are described below with respect to FIGS. 9A, 9B, 10A, 10B and 10C.

The antenna array can include a set of multiple connected antennas that can act as a single antenna to transmit and/or receive RF energy. These multiple connected antennas can include short radiating slots that can be coupled with a matching metasurface in embodiments of the present invention. These slots can include slots in the cathode layer 240 and/or anode layer 230 where the cathode layer 240 and anode layer 230 can electrically interact with an LED. An antenna array can be preferable to a single antenna element because an antenna array can achieve higher gain and directivity than a single antenna element. The larger the number of individual antenna elements used by an antenna array, the higher the gain and also the narrower the beam of radio waves that can be received and/or transmitted.

Figure 9A:
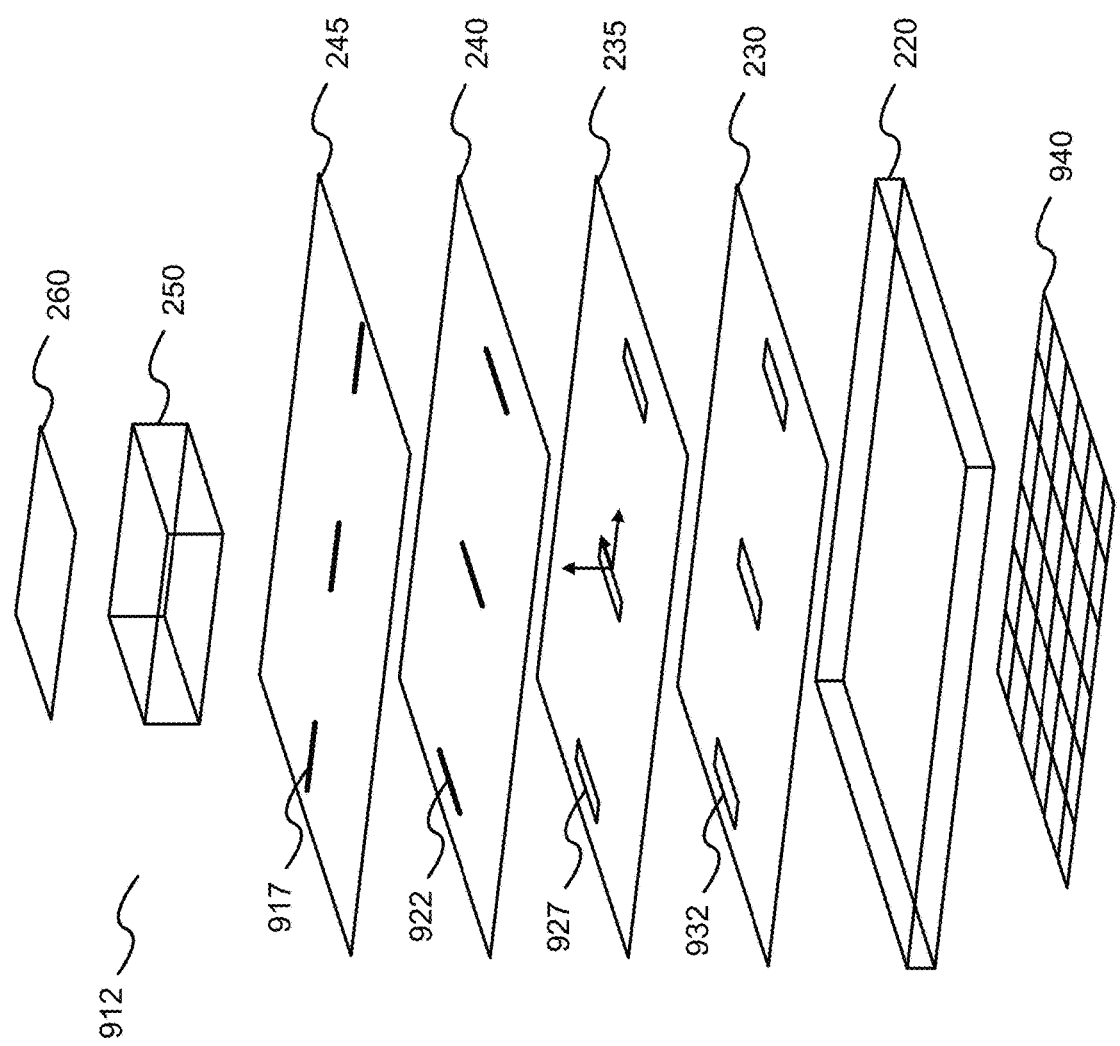
FIG. 9A illustrates a simplified, exploded view of an antenna and visual display apparatus, according to an embodiment of the present invention.
Figure 9B:
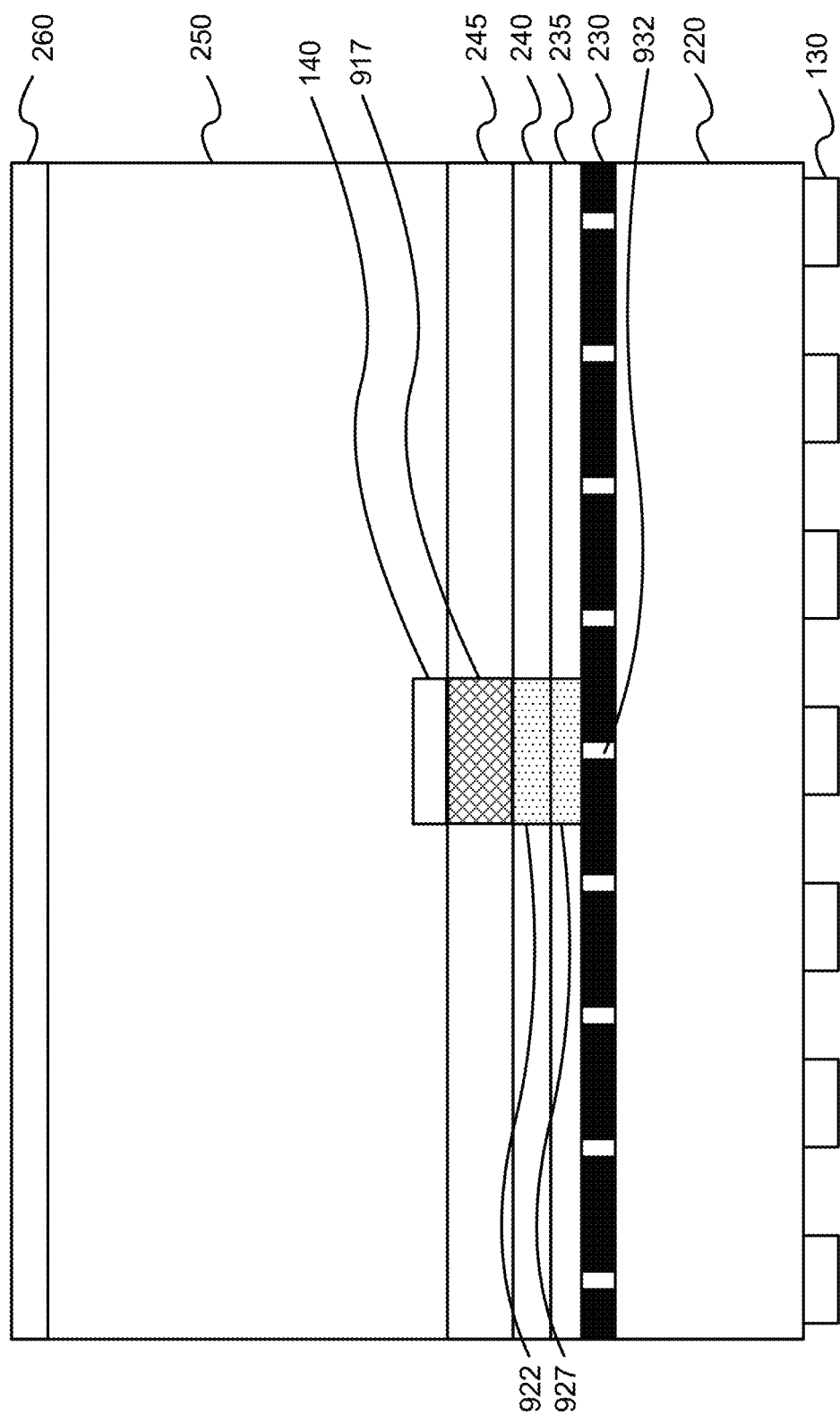
FIG. 9B illustrates a side view of the assembled antenna and visual display apparatus of FIG. 9A.

FIG. 9A illustrates a simplified, exploded view of an antenna and visual display apparatus, according to an embodiment of the present invention. FIG. 9B illustrates a side view of the assembled antenna and visual display apparatus of FIG. 9A. Some components or layers may be omitted for clarity. Illustrated layers are assembled so as to be adjacent to each other, with the bottom most layer being considered the exterior layer. A back metal cover 260 and silicon base material layer 250 are provided to form a back cavity 912. An AID feed substrate 245 comprising RF (antenna) feeds 917 and related conductive traces 140 is provided adjacent to a conductive layer 240. Coupling slots 922 are formed in the conductive layer 240 and aligned with the antenna feeds. The conductive layer 240 also functions as a cathode layer for the visual display (e.g. OLED). An OLED film 235 is adjacent to the conductive layer 240, and includes gaps 927 in which OLED pixels or sub-pixels are omitted, the gaps being aligned with the coupling slots 922. An anode layer 230 is adjacent to the OLED film 235, and also includes gaps 932 aligned with the coupling slots 922. A glass (or other transparent material) substrate 220 is adjacent to the anode layer 230. Multiple RF patches 130 are adjacent to the glass substrate 220. The matching metasurface layer 940 can include conductive patches which operatively couple with the coupling slots 922 to assist in directing antenna signals through the glass substrate. In some embodiments, the matching metasurface layer can be formed of a material such as ITO, and can also be used as part of a touch screen, i.e. a touch-sensitive control surface user interface.

Figure 10A:
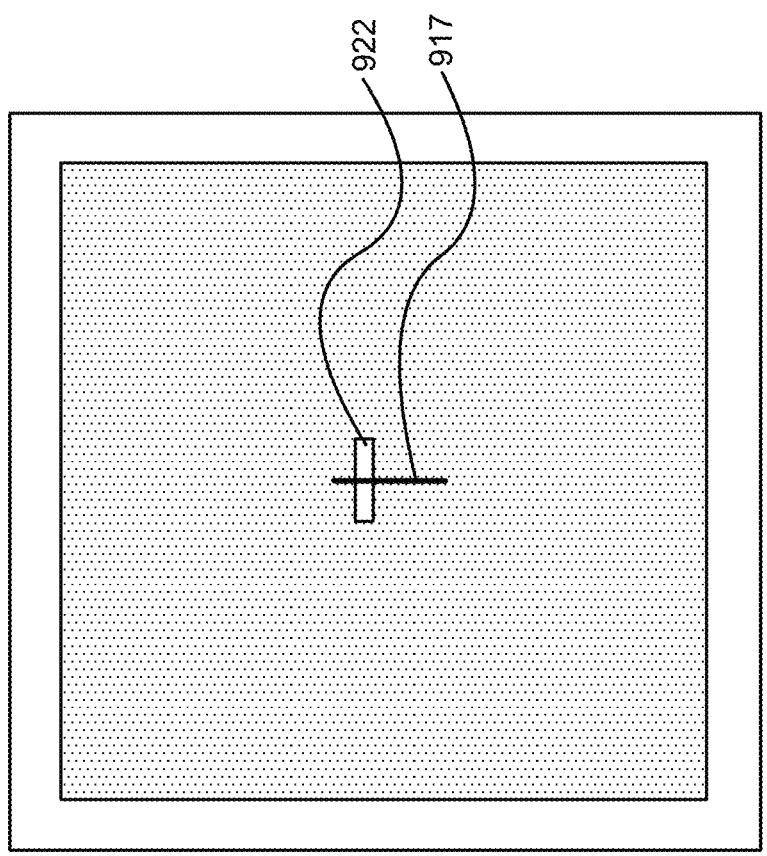
FIG. 10A illustrates a top view of a first layer of an antenna in display apparatus, showing an RF feed adjacent to a coupling slot acting as an antenna radiating element, according to an embodiment of the present invention.
Figure 10B:
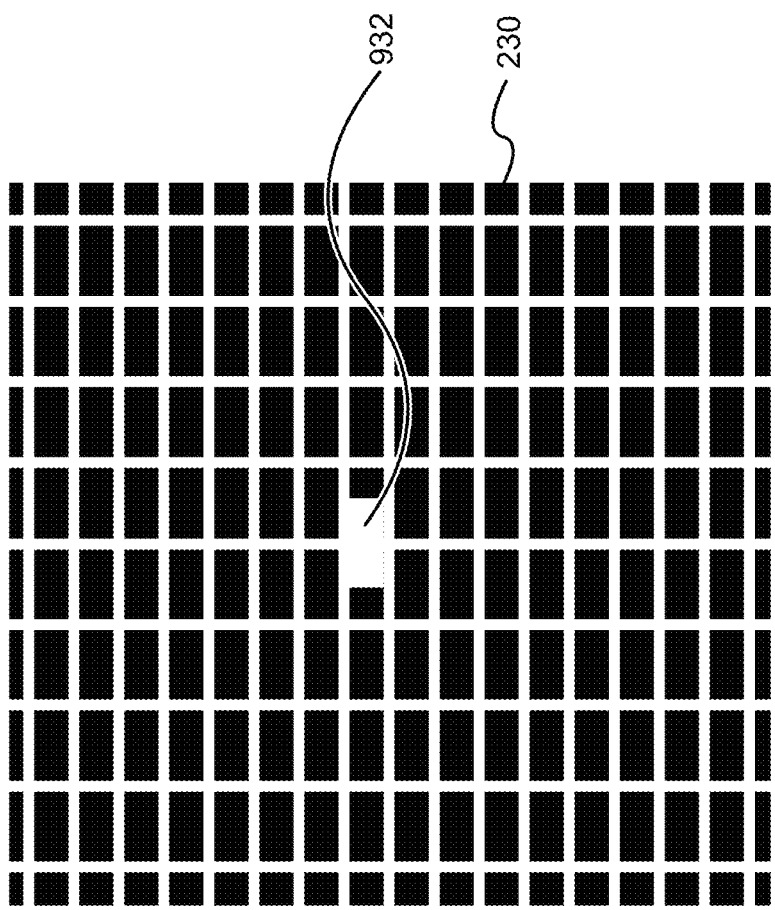
FIG. 10B illustrates a top view of a second (anode) layer of the antenna in display apparatus of FIG. 10A, showing a gap in an OLED anode layer, according to an embodiment of the present invention.
Figure 10C:
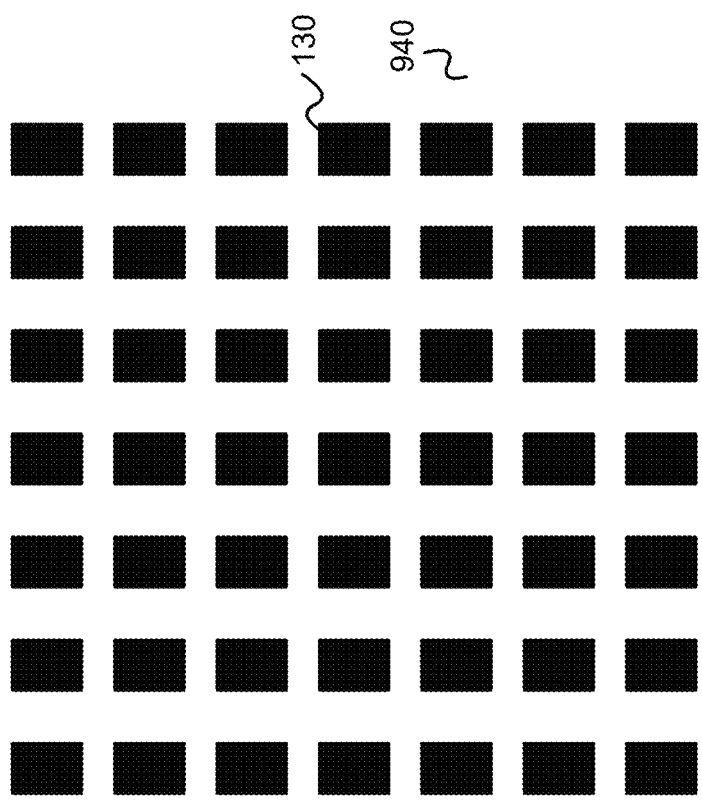
FIG. 10C illustrates a top view of a third (matching metasurface) layer of the antenna in display apparatus of FIG. 10A, showing an array of patches of a matching metasurface layer.

FIG. 10A illustrates a top view showing an RF feed 917 adjacent to a coupling slot 922, which acts as an antenna radiating element. The RF feed is perpendicular to the coupling slot in this embodiment. FIG. 10B illustrates a gap 932 in the anode layer 230, which can, in some embodiments, also function as part of the antenna radiating element and/or coupling slot. FIG. 10C illustrates an array of RF patches 130 of the matching metasurface layer 940. These patches couple with the coupling slots to facilitate transmission of antenna signals, e.g. by providing an impedance-matched antenna structure and/or directing the RF energy of the antenna signals outward from the coupling slot 922. Sizing and spacing of the patches can be configured to provide a desired electromagnetic behaviour and corresponding antenna radiation pattern.

According to various embodiments, a typical slot radiator has a slot length of approximately $\lambda/2$ in free space, where $\lambda$ denotes an operating wavelength (e.g. inversely proportional to center radio frequency) of the antenna array. In embodiments, the radiating slots are embedded in between two layers of silicon material with a thick glass substrate on one side. As a result, a radiating slot with a length of significantly less than $\lambda/2$ becomes possible. These short radiating slots ($<\lambda/2$) are fed electromagnetically by RF feeds, such as microstrip lines, at the top layer of the back-end structure. Due to its relatively small aperture, a short radiating slot has a significantly wider radiation pattern compared to that of a typical radiating element such as a patch. When RF power are fed to the slots from microstrip feed lines, EM fields are radiated from these slots through front of the visual display via a thick layer of protective glass. However, due to relatively high permittivity of the glass substrate ($\varepsilon r \approx 4.5$), most of the EM power is potentially trapped in the form of surface waves and is subject to loss in the thick layer of lossy protective (and electrically thick) glass substrate. This is due to low resistivity and high permittivity of the silicon substrate, for example, which tend to cause high ohmic losses and surface wave losses. In such cases, and without further steps to address, only small fraction (e.g. less than a few percent) of the total RF power will be transmitted through the glass substrate. To address this problem, a proton implantation process is implemented to increase resistivity of the base silicon from about 10 ohm-cm to over 1 k$\Omega$-cm. Furthermore, a matching metasurface layer comprising a periodic array of small metallic patches with dimensions of less than $\lambda/4$ is provided on the outer surface (air-glass interface) of the glass substrate. The metasurface can improve radiation efficiency significantly with limited to no degradation in scanning range of the short radiating slots. This may be attributed to the relatively small size of patches (less than $\lambda/4$) with relatively large element spacing. The metallic pattern on the metasurface is designed to impedance-match with the radiating slots for a given glass-substrate thickness and slot geometries. In some embodiments, the metasurface is also configured to function as part of a touch-screen.

In various embodiments, the (e.g. glass) substrate is electromagnetically thick. A dielectric substrate is considered to be electromagnetically thick when the thickness is relatively large compared to the operating wavelength in the substrate material, which is also a function of the dielectric permittivity. For example, an electromagnetically thick substrate may have a thickness of between 100 µm and 700 µm. The substrate may have high permittivity in the sense of electromagnetic permittivity, which would be readily understood by a worker skilled in the art. For example, the substrate may have a permittivity of about 11.7 farads per meter (for Silicon material).

Figure 11:
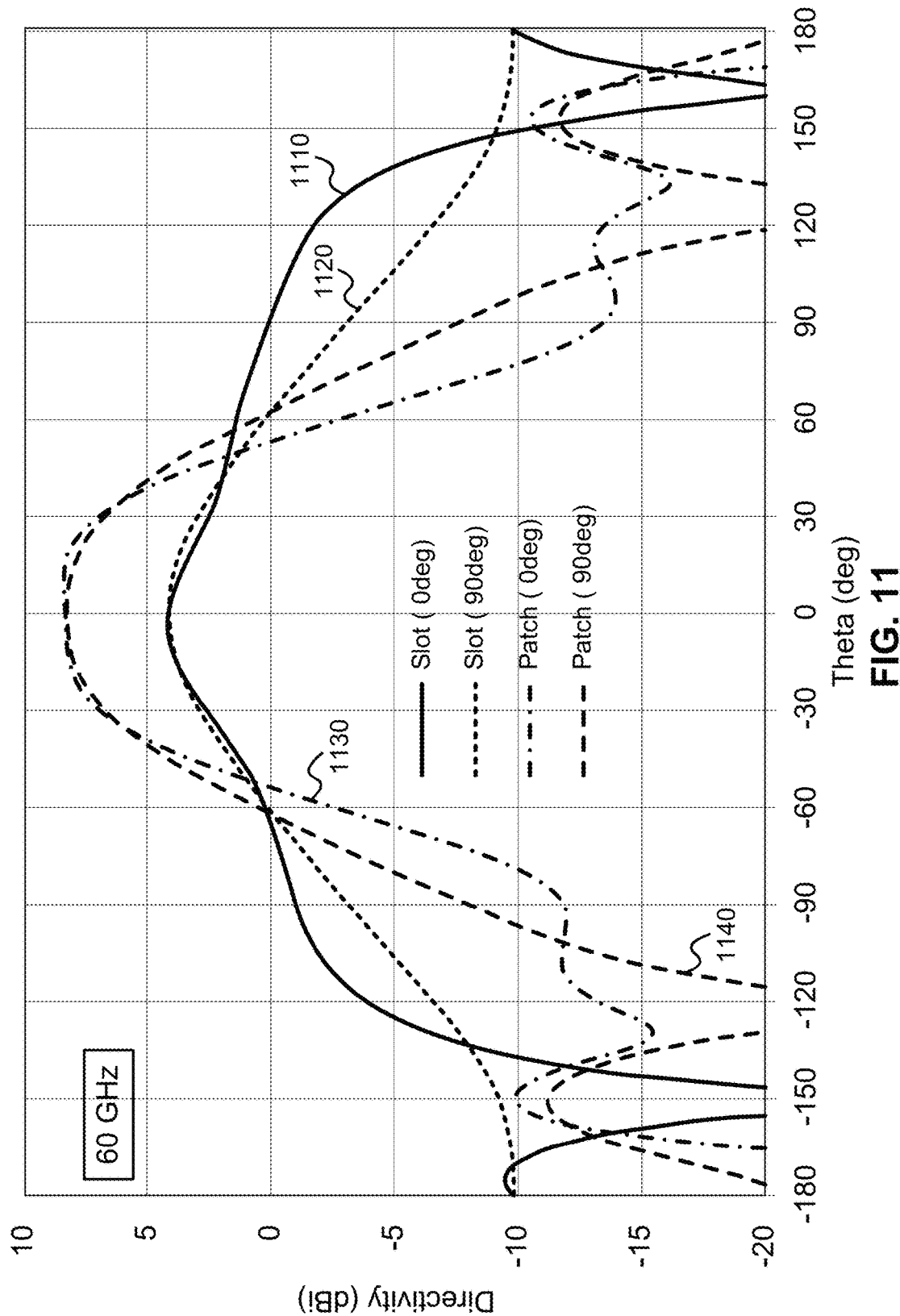
FIG. 11 illustrates a typical radiation pattern of a short slot antenna, compared to that of a typical patch with same size ground plane.

FIG. 11 illustrates a typical radiation pattern of the short slot 1110 and 1120 compared to that of a typical patch 1130 and 1140 with same size ground plane (approximately one $\lambda$ ground plane). As can be seen, a short-slot radiator allows beam scanning with a much wider angle with less scan losses compared to a typical high-gain radiator such a patch antenna. The vertical axis shows directivity in dBi, while the horizontal axis shows angle away from the bore sight in degrees.

Figure 12A:
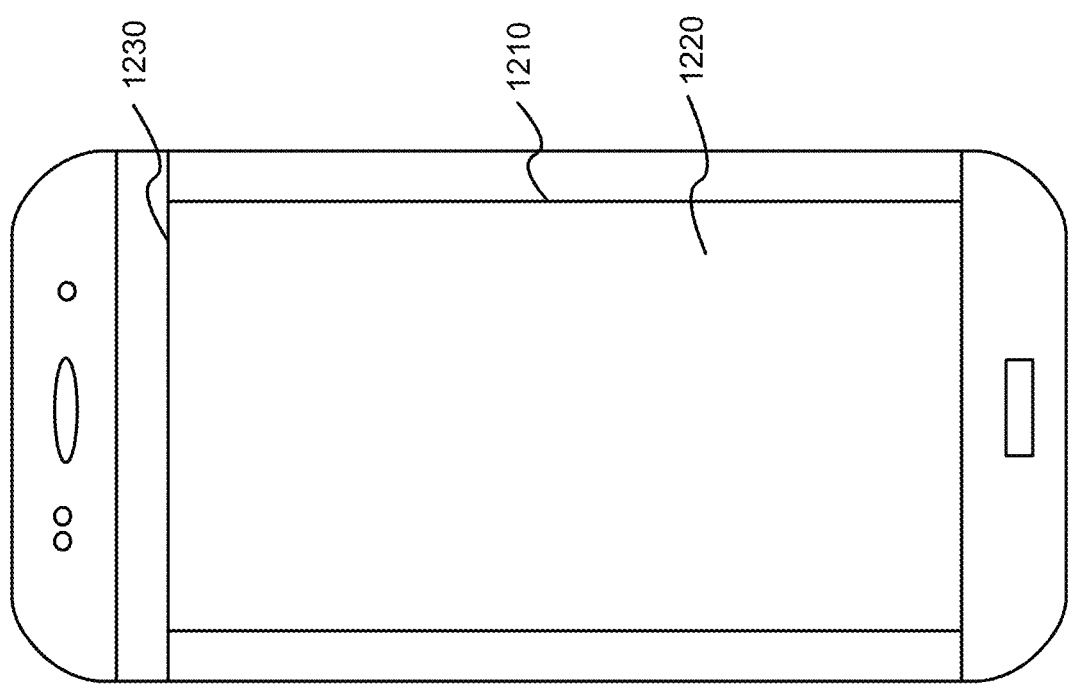
FIG. 12A illustrates a smart phone device with different potential edge locations for an antenna-in-display apparatus, according to embodiments of the present invention.

In some embodiments, the above-described antenna and display apparatus (e.g. short-slot AID array) can be implemented throughout the entire display screen (known to those skilled in the art as a visual display) area of a device. However, for data communications, an array of radiators placed along edges of a display screen only may provide suitable performance, while also mitigating direct interference with other functions such as screen control operations. For near-range imaging, the array of radiators can be located under a central portion of the display screen, without necessarily extending to some or all edges. FIG. 12A illustrates a smart phone device with different potential edge locations 1210, 1230 for an antenna-in-display (AID) apparatus according to embodiments of the present invention. These edge locations may be appropriate for mmWave applications, and may allow better radiation performance in the back direction. Also illustrated is a central location 1220 for an antenna-in-display (AID) apparatus according to embodiments of the present invention, which may be appropriate for THz imaging applications. Also shown is a representation of the antenna array, including metasurface patches overtop of a pixel array.

Figure 12B:
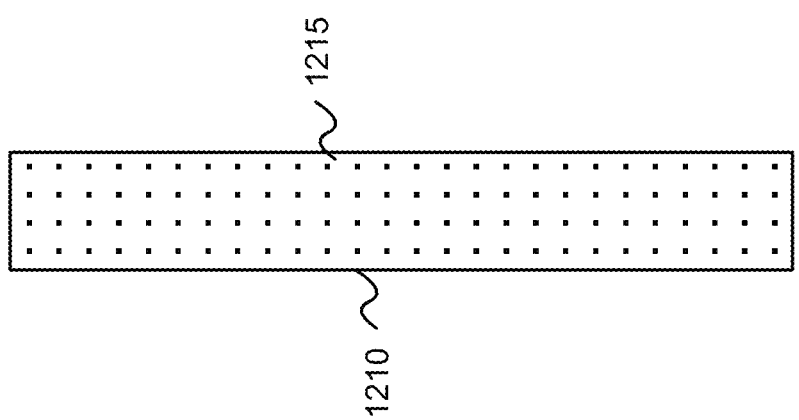
FIG. 12B illustrates an antenna array, according to embodiments of the present invention.

FIG. 12B illustrates a non-limiting example antenna array 1215 for edge position 1210.

In an example embodiment, a 28×4 high-gain AID phased array with an overall of approximately 51 mm×8.5 mm (10λ×1.7λ) may be provided. That is, the array includes 4 rows of 28 antenna elements each. Element spacing is 1.8 mm and 2.0 mm in E-plane and H-plane, respectively. The radiating slot is 0.05 mm×0.5 mm and dimensions of matching patches on the metasurface are 0.3 mm×0.4 mm. This array size can be fit into the top side of a typical 5" smart phone device.

Table 2 shows estimated antenna spacing and directivities located for an antenna array of the form 1215 at an edge location 1210, according to an example embodiment. It is assumed that the antenna size is 10 mm×60 mm.

TABLE 2

| Frequency (GHz) | Free-space λ (mm) | Spacing λ/2 (mm) | Directivity (dBi) |
| --- | --- | --- | --- |
| 24 | 12.5 | 6.25 | 21 |
| 28 | 10.7 | 5.35 | 22 |
| 39 | 7.7 | 3.85 | 25 |
| 58 | 5.2 | 2.60 | 28 |
| 70 | 4.3 | 2.15 | 30 |
| 94 | 3.2 | 1.60 | 32 |
| 100 | 3.0 | 1.50 | 33 |

Figure 13:
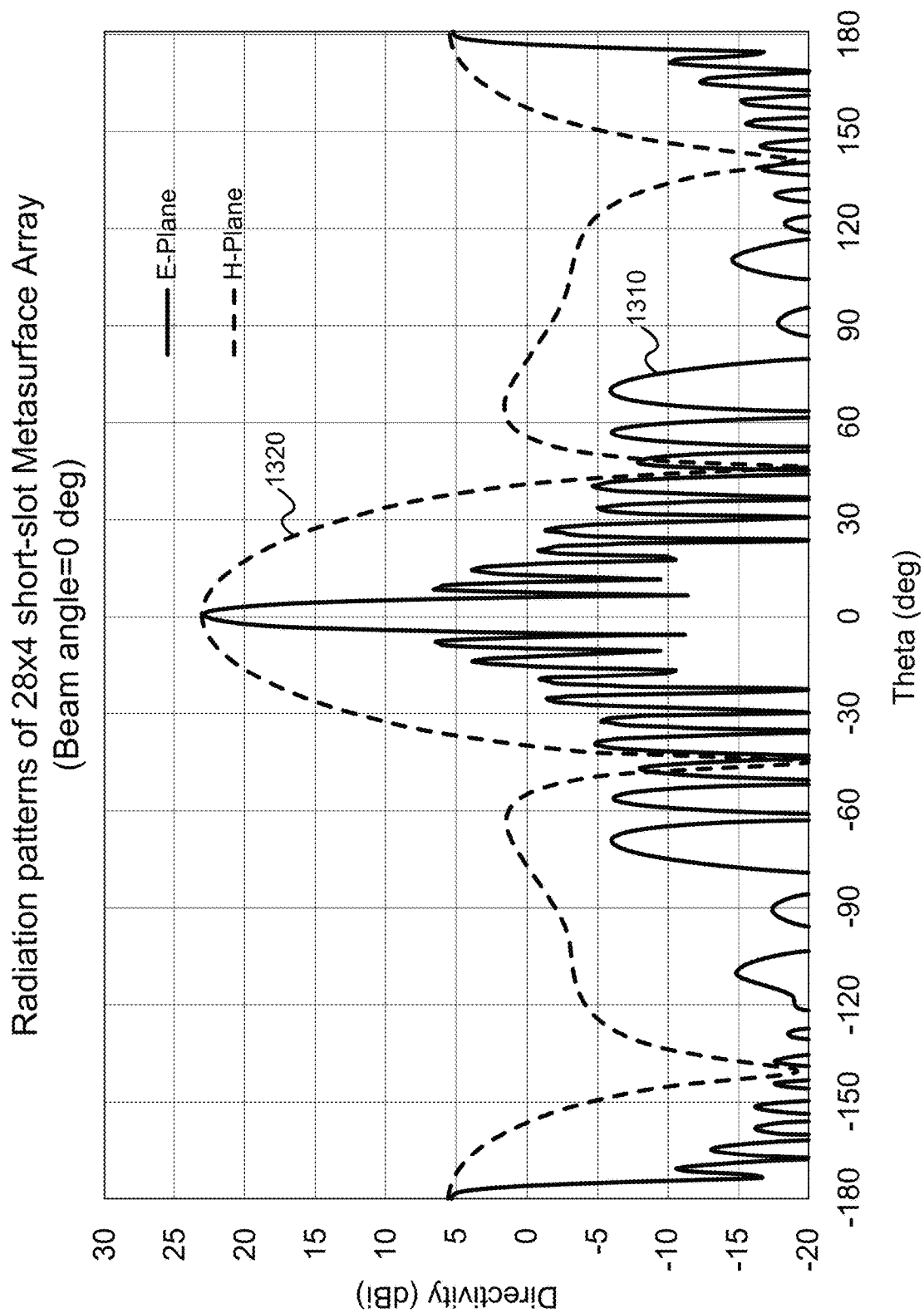
FIGS. 13, 14 and 15 illustrate simulated radiation patterns for a 28×4 antenna array provided in accordance with an example embodiment of the present invention.
Figure 14:
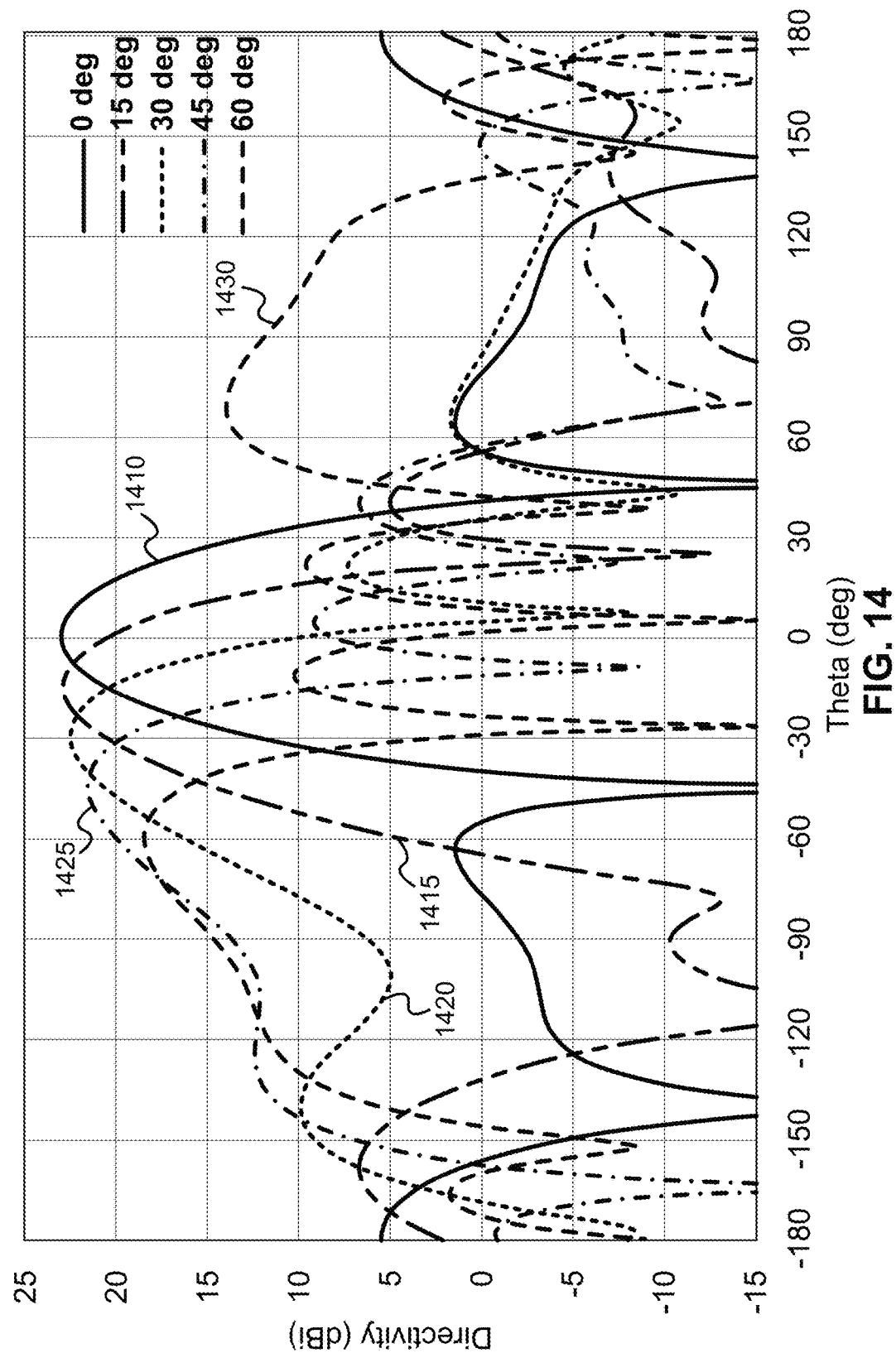
Figure 15:
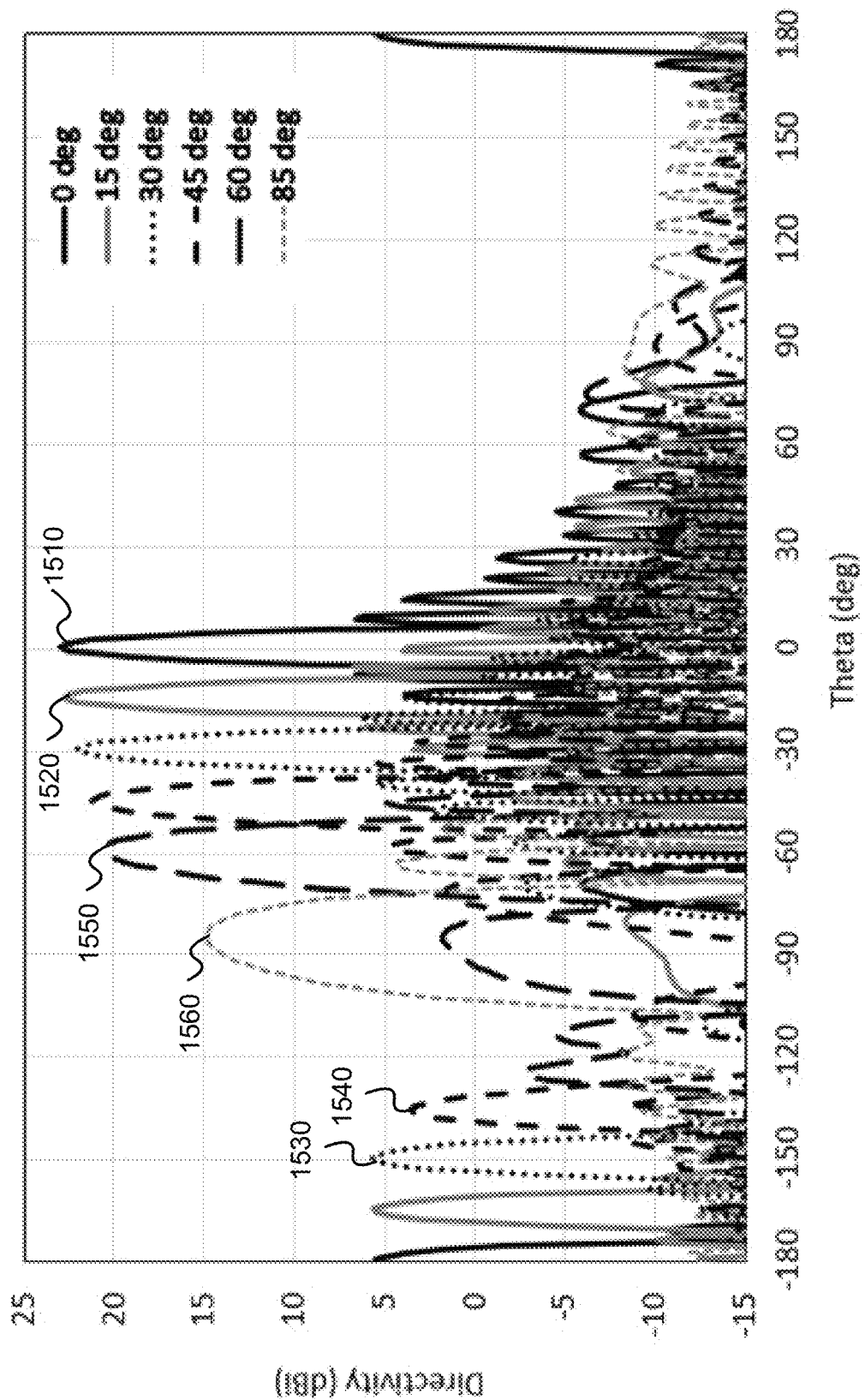

FIGS. 13, 14 and 15 illustrate simulated radiation patterns for the 28×4 antenna array described above. These figures shows that such array is capable of producing a high-gain beam that can be steered over a very large angular range of over ±80 deg in the E-plane and over ±60 deg in the H-plane, which are significantly wider angles than any typical phased array. FIG. 13 illustrates the directivity of the E-Plane 1310 and H-Plane 1320. FIG. 14 illustrates the directivity of 0 degree 1410, 15 degree 1415, 30 degree 1420, 45 degree 1425, and 60 degree 1430 phased array. FIG. 15 illustrates directivity of 0 degree 1510, 15 degree 1520, 30 degree 1530, 45 degree 1540, 60 degree 1550, and 85 degree 1560 phased array.

Although the present invention has been described with reference to specific features and embodiments thereof, it is evident that various modifications and combinations can be made thereto without departing from the invention. The specification and drawings are, accordingly, to be regarded simply as an illustration of the invention as defined by the appended claims, and are contemplated to cover any and all modifications, variations, combinations or equivalents that fall within the scope of the present invention.

What is claimed is:

1. An antenna and visual display apparatus comprising:
an antenna feed layer comprising an array of antenna feeds for a corresponding antenna array;
a visual display layer exterior and adjacent to the antenna feed layer, the visual display layer comprising an array of light emitting diodes and control elements coupled thereto for operating the light emitting diodes to provide a visual display, the visual display layer further comprising an array of apertures formed by omitting a subset of the array of light emitting diodes in an otherwise regular array and having sizing and spacing configured, according to an operating wavelength of the antenna array, to couple with respective ones of the antenna feeds to facilitate transmission of antenna signals for the antenna array;
an optically transparent substrate exterior and adjacent to the visual display layer; and
an array of conductive and optically transparent elements exterior and adjacent to the optically transparent substrate, the array of conductive and optically transparent elements configured to couple with the array of apertures to direct the antenna signals through the optically transparent substrate.

2. The apparatus of claim 1, wherein either:
the array of light emitting diodes comprises red, green, blue and white light emitting diodes, and wherein omitting the subset of the array of light emitting diodes comprises omitting a subset of the white light emitting diodes; or
the array of light emitting diodes comprises red, green and blue light emitting diodes, and wherein omitting the subset of the array of light emitting diodes comprises omitting a subset of the green light emitting diodes.

3. The apparatus of claim 1, wherein the array of conductive and optically transparent elements is a periodic array, each conductive element being an electrically small patch.

4. The apparatus of claim 1, wherein the array of apertures are formed from slots in an anode conductive layer and a cathode conductive layer, the anode conductive layer and the cathode conductive layer configured to electrically interact with the light emitting diodes for operation thereof.

5. The apparatus of claim 4, wherein the cathode conductive layer is further configured to operate as a ground layer for the antenna array.

6. The apparatus of claim 1, wherein the antenna array spans an entire area of the visual display, or wherein the antenna array spans a region which is less than an entire area of the visual display, and said region is co-located with one or more edges of the visual display, or said region is co-located with a central portion of the visual display.

7. A visual display apparatus comprising:
a visual display layer comprising an array of light emitting diodes and control elements coupled thereto for operating the light emitting diodes to provide a visual display; and
an array of apertures formed in the visual display layer by omitting a subset of the array of light emitting diodes in an otherwise regular array, the array of apertures having sizing and spacing configured, according to an operating wavelength of the antenna array, to: couple with a set of antenna feeds to facilitate transmission of antenna signals for an antenna array.

8. The apparatus of claim 7, wherein either:
the array of light emitting diodes comprises red, green, blue and white light emitting diodes, and wherein omitting the subset of the array of light emitting diodes comprises omitting a subset of the white light emitting diodes; or
the array of light emitting diodes comprises red, green and blue light emitting diodes, and wherein omitting the subset of the array of light emitting diodes comprises omitting a subset of the green light emitting diodes.

9. The apparatus of claim 7, further comprising an optically transparent substrate exterior and adjacent to the visual display layer, and an array of conductive and optically transparent elements exterior and adjacent to the optically transparent substrate, the array of conductive and optically transparent elements having sizing and spacing configured to couple with the array of apertures to direct the antenna signals through the optically transparent substrate.

10. The apparatus of claim 9, wherein the array of conductive and optically transparent elements is integrated with a touch-sensitive control surface user interface.

11. An antenna apparatus comprising:
an antenna feed layer comprising an array of antenna feeds for a corresponding antenna array;
a substrate exterior to the antenna feed layer;
an array of conductive elements exterior and adjacent to the optically transparent substrate, the array of conductive elements having sizing and spacing configured to couple directly or indirectly with the array of antenna feeds to direct antenna signals through the substrate; and
an array of primary radiating antenna elements located between the antenna feed layer and the substrate.

12. The antenna apparatus of claim 11, wherein the substrate is optically transparent.

13. The antenna apparatus of claim 12, further comprising a visual display layer between the antenna feed layer and the substrate, the visual display layer comprising an array of light emitting diodes and control elements coupled thereto for operating the light emitting diodes to provide a visual display, the visual display layer further comprising an array of apertures having sizing and spacing configured, according to an operating wavelength of the antenna array, to couple with respective ones of the antenna feeds to facilitate transmission of antenna signals for the antenna array.

14. The antenna apparatus of claim 11, wherein the array of conductive elements is optically transparent and is integrated with a touch-sensitive control surface user interface.

15. The antenna apparatus of claim 11, wherein the substrate is electromagnetically thick with high permittivity.

16. The antenna apparatus of claim 11, wherein the primary radiating antenna elements are slots or dipoles, and wherein the slots or dipoles are electrically small, having an electrical length which is less than half of a free-space operating wavelength of the antenna array.

17. The antenna apparatus of claim 11, wherein some or all of the conductive elements are electrically small.

* * * * *

UNITED STATES PATENT AND TRADEMARK OFFICE
CERTIFICATE OF CORRECTION

PATENT NO. : 11,557,825 B2
APPLICATION NO. : 17/065166
DATED : January 17, 2023
INVENTOR(S) : Senglee Foo and Wen Tong It is certified that error appears in the above-identified patent and that said Letters Patent is hereby corrected as shown below:

In the Specification

Column 14, Line 3, "($\varepsilon r \neq 4.5$)" should read --($\varepsilon r \approx 4.5$)--

Signed and Sealed this
Twenty-seventh Day of June, 2023

Katherine Kelly Vidal
*Director of the United States Patent and Trademark Office*